US012574126B2

(12) United States Patent
Shrivastava et al.

(10) Patent No.: US 12,574,126 B2
(45) Date of Patent: Mar. 10, 2026

(54) ULTRA LOW POWER WAKE UP RADIO ARCHITECTURE

(71) Applicant: Northeastern University, Boston, MA (US)

(72) Inventors: Aatmesh Shrivastava, Weston, MA (US); Ankit Mittal, Jamaica Plain, MA (US)

(73) Assignee: Northeastern University, Boston, MA (US)

( * ) Notice: Subject to any disclaimer, the term of this patent is extended or adjusted under 35 U.S.C. 154(b) by 418 days.

(21) Appl. No.: 18/274,304

(22) PCT Filed: Jan. 19, 2022

(86) PCT No.: PCT/US2022/012921
§ 371 (c)(1),
(2) Date: Jul. 26, 2023

(87) PCT Pub. No.: WO2022/169593
PCT Pub. Date: Aug. 11, 2022

(65) Prior Publication Data
US 2024/0089018 A1 Mar. 14, 2024

Related U.S. Application Data

(60) Provisional application No. 63/144,654, filed on Feb. 2, 2021.

(51) Int. Cl.
*H04B 17/318* (2015.01)
*H03C 3/00* (2006.01)
*H03G 3/30* (2006.01)

(52) U.S. Cl.
CPC ........... *H04B 17/318* (2015.01); *H03C 3/005* (2013.01); *H03G 3/3052* (2013.01)

(58) Field of Classification Search
CPC ..... H04B 17/318; H03C 3/005; H03C 3/3052
See application file for complete search history.

(56) References Cited

U.S. PATENT DOCUMENTS 3,879,674 A * 4/1975 Dragon ................ H03G 3/3005
4,554,508 A * 11/1985 Haque ..................... H04L 1/206
324/76.72

(Continued)

FOREIGN PATENT DOCUMENTS

WO WO-2022/169593 A1 8/2022

OTHER PUBLICATIONS

International Search Report and Written Opinion for International Application No. PCT/US2022/012921 dated Apr. 14, 2022.

*Primary Examiner* — Junpeng Chen
(74) *Attorney, Agent, or Firm* — Foley Hoag LLP; Dana M. Gordon; Erik A. Huestis

(57) ABSTRACT

A radio frequency (RF) signal strength detection technique is disclosed with a received signal strength indicator (RSSI) circuit, which can be deployed in an internet-of-things (IoT) network. The RSSI circuit is based on a direct conversion of RF to digital code indicating the signal strength. The direct conversion is achieved by the repeated switching of a rectifier's output voltage using an ultra-low power comparator. A 5-bit programmable feedback circuit can be used to correct detection inaccuracies. The RSSI circuit can be implemented in a 65-nm CMOS process and consumes 15 nW power. It can have a linear dynamic range of 26 dB and exhibit an error of ±0.5 dB with a wide bandwidth of 500 MHz. The technique has been verified with simulation and measurement results. The high detection accuracy with ultra-low power consumption of the proposed RSSI circuit is favorable for IoT applications including, e.g., biomedical, localization, and other low-power applications.

20 Claims, 21 Drawing Sheets

(56) References Cited

U.S. PATENT DOCUMENTS

| | | | | |
|---|---|---|---|---|
| 7,660,567 B1 * | 2/2010 | Gehring | ............... | H04B 17/318 |
| | | | | 455/226.2 |
| 9,413,403 B2 * | 8/2016 | Wentzloff | ............ | H04B 1/1027 |
| 2002/0190689 A1 * | 12/2002 | Nakamura | .............. | H02J 50/70 |
| | | | | 320/102 |
| 2008/0164913 A1 | 7/2008 | Hirata et al. | | |
| 2009/0170460 A1 | 7/2009 | Reis | | |
| 2014/0117974 A1 | 5/2014 | Chou et al. | | |
| 2015/0063504 A1 | 3/2015 | Fan et al. | | |
| 2015/0087255 A1 * | 3/2015 | Wentzloff | ............ | H04B 1/1027 |
| | | | | 455/296 |
| 2019/0158133 A1 * | 5/2019 | Wang | ................... | H04B 1/1615 |

\* cited by examiner

TABLE I

DEVICE IMPLEMENTATION FOR RECTIFIER

| Device | Type | Property |
|---|---|---|
| $M_{1-10}$ | NCH_LVT | W/L=200n/60n |
| $M_{x(1-10)}$ | NCH_LVT | W/L=200n/60n |
| $C_{1-10}$ | MIM | $\approx$ 200 fF |

FIG. 23

TABLE II

DEVICE IMPLEMENTATION FOR COMPARATOR

| Device | Type | Property |
|---|---|---|
| $M_1,M_2, M_3,M_4$ | PCH | W/L=500n/500n |
| $M_5,M_6$ | PCH | W/L=200n/60n |
| $M_7,M_8$ | NCH_LVT | W/L=1$\mu$/500n |
| $M_9$ | NCH_LVT | W/L=2$\mu$/500n |
| $M_{10}$ | PCH | W/L=800n/200n |
| $M_{11}$ | NCH_HVT | W/L=200n/1$\mu$ |

FIG. 24

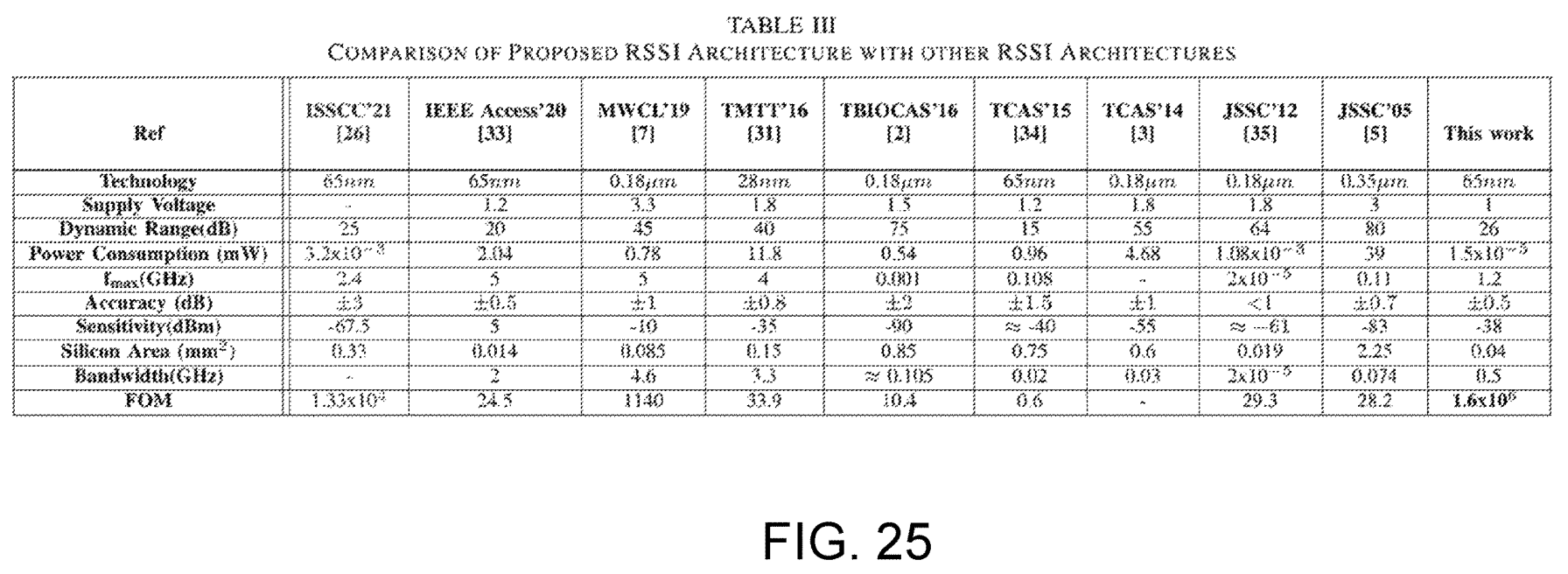

TABLE III

COMPARISON OF PROPOSED RSSI ARCHITECTURE WITH OTHER RSSI ARCHITECTURES

| Ref | ISSCC'21 [26] | IEEE Access'20 [33] | MWCL'19 [7] | TMTT'16 [31] | TBIOCAS'16 [2] | TCAS'15 [34] | TCAS'14 [3] | JSSC'12 [35] | JSSC'05 [5] | This work |
|---|---|---|---|---|---|---|---|---|---|---|
| Technology | 65nm | 65nm | 0.18$\mu m$ | 28nm | 0.18$\mu m$ | 65nm | 0.18$\mu m$ | 0.18$\mu m$ | 0.35$\mu m$ | 65nm |
| Supply Voltage | - | 1.2 | 3.3 | 1.8 | 1.5 | 1.2 | 1.8 | 1.8 | 3 | 1 |
| Dynamic Range(dB) | 25 | 20 | 45 | 40 | 75 | 15 | 55 | 64 | 80 | 26 |
| Power Consumption (mW) | $3.2 \times 10^{-3}$ | 104 | 0.78 | 11.8 | 0.54 | 0.06 | 4.68 | $1.08 \times 10^{-3}$ | 39 | $1.5 \times 10^{-3}$ |
| $f_{max}$(GHz) | 2.4 | 5 | 5 | 4 | 0.001 | 0.108 | - | $2 \times 10^{-5}$ | 0.11 | 12 |
| Accuracy (dB) | ±3 | ±0.5 | ±1 | ±0.8 | ±5 | ±1.5 | ±1 | <1 | ±0.7 | ±0.5 |
| Sensitivity(dBm) | -67.5 | 5 | -10 | -35 | -90 | ≈-40 | -55 | ≈-61 | -83 | -38 |
| Silicon Area (mm²) | 0.35 | 0.014 | 0.085 | 0.15 | 0.85 | 0.75 | 0.6 | 0.019 | 2.25 | 0.04 |
| Bandwidth(GHz) | - | 2 | 4.6 | 13 | ≈0.105 | 0.02 | 0.03 | $2 \times 10^{-5}$ | 0.074 | 0.5 |
| FOM | $1.33 \times 10^{5}$ | 24.5 | 1140 | 33.9 | 10.4 | 0.6 | - | 29.3 | 28.2 | $1.6 \times 10^{6}$ |

FIG. 25

ULTRA LOW POWER WAKE UP RADIO ARCHITECTURE

CROSS REFERENCE TO RELATED APPLICATIONS

This application is a 35 U.S.C. § 371 national-stage application based on International Application No. PCT/US2022/012921, filed 19 Jan. 2022; which claims priority to U.S. Provisional Patent Application No. 63/144,654, filed 2 Feb. 2021, entitled ULTRA LOW POWER WAKE UP RADIO ARCHITECTURE, the contents of each of which is hereby incorporated by reference in its entirety.

BACKGROUND

The present application relates generally to radio frequency (RF) signal strength detection with a received signal strength indicator (RSSI) circuit that can be deployed in an internet-of-things (IoT) network. RSSI circuits in accordance with various embodiments are based on a direct conversion of RF to digital code indicating the signal strength. The direct conversion is achieved by the repeated switching of a rectifier's output voltage using an ultra-low power comparator. In one or more embodiments, a 5-bit programmable feedback circuit is used to correct detection inaccuracies. The RSSI circuit can be implemented in a 65-nm CMOS process and consume 15 nW power. It can have a linear dynamic range of 26 dB and exhibit an error of ±0.5 dB with a wide bandwidth of 500 MHz. The high detection accuracy with ultra-low power consumption of the RSSI circuit is favorable for various IoT applications including, e.g., biomedical, localization, and other low-power applications.

BRIEF SUMMARY OF THE DISCLOSURE

In accordance with one or more embodiments, a method is disclosed for detecting RF signal strength using an RSSI circuit in a wake up radio of an RF receiver. The method includes the steps of: (a) receiving an incoming RF signal; (b) rectifying the RF signal in a multi-stage passive rectifier to generate an output voltage; (c) comparing the output voltage to a threshold voltage in a comparator and generating a toggle signal when the output voltage exceeds the threshold voltage; (d) feeding the toggle signal to the multi-stage passive rectifier to discharge a capacitor for each stage of the multi-stage passive rectifier to enable another charging cycle; (e) repeating steps (b) to (d) a plurality of times during a duration of the RF signal; and (f) counting the toggle signals from the comparator to generate a digital code indicative of the detected strength of the RF signal; and (g) outputting the digital code.

In accordance with one or more embodiments, an RSSI circuit is disclosed in a wake up radio of an RF receiver for detecting RF signal strength. The RSSI circuit includes a multi-stage passive rectifier for rectifying an incoming RF signal to generate an output voltage. A comparator coupled to the multi-stage passive rectifier compares the output voltage to a threshold voltage and generates a toggle signal when the output voltage exceeds the threshold voltage. The comparator feeds the toggle signal to the multi-stage passive rectifier to discharge a capacitor for each stage of the multi-stage passive rectifier to enable another charging cycle for a plurality of times during a duration of the RF signal. A counter coupled to the comparator counts the toggle signals from the comparator to generate a digital code indicative of the detected strength of the RF signal.

BRIEF DESCRIPTION OF THE DRAWINGS

FIG. 23 shows Table I.

FIG. 24 shows Table II.

FIG. 25 shows Table III.

DETAILED DESCRIPTION

I. Introduction

Figure 1:
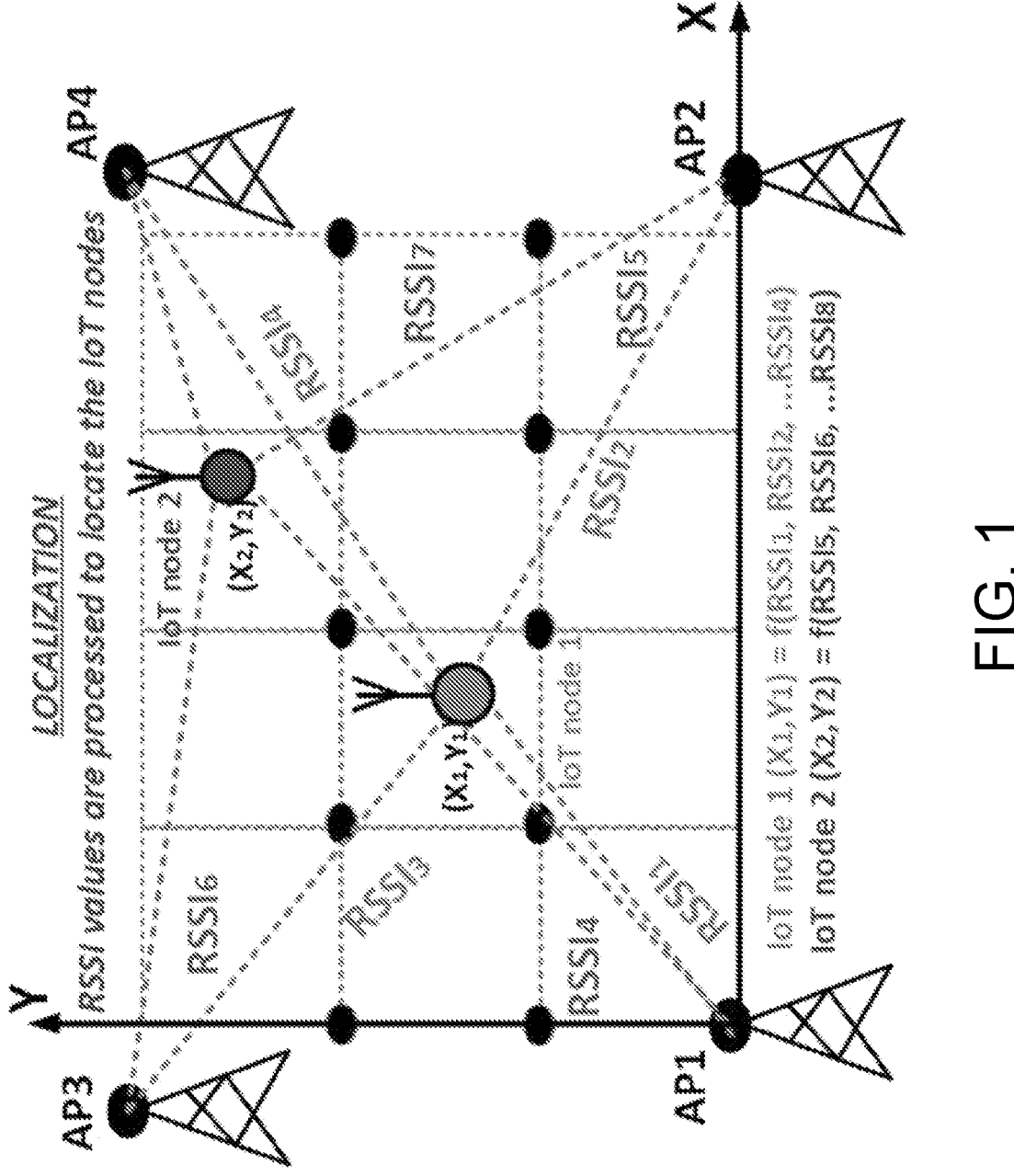
FIG. 1 is a diagram illustrating localization of IoT nodes, where RSSI values from different IoT nodes can be processed by the access points (AP) to locate their position.

The growth of IoT networks is unleashing a new era of low-power connected devices with an anticipated 75 billion IoT devices being expected to be connected in the network by the year 2025 [1]. Enabling wireless technologies such as Bluetooth, ZigBee, LTE, Lo-RaWAN, and SigFox have technologically advanced wireless communication in the IoT landscape. However, a reliable communication in a densely deployed network of IoT devices with shared spectrum is becoming increasingly challenging. The reliability of wireless communication is challenged by several issues on the account of "hostility" of the wireless channels. The spatio-temporal fluctuations in the wireless channel, which include shadowing, multipath propagation, propagation loss, and inter symbol interference (ISI) affect the transmitted signal, introducing random variations in the signal strength, where signal power can vary by several orders of magnitude. The high variation in the received radio frequency (RF) signal requires a wider dynamic range detection circuit for the RF receivers to be robust and adaptive to fluctuations. RF receivers must be sensitive to low magnitude signal while also ensuring that a higher magnitude input signal does not lead to internal saturation.

Various magnitude control architectures including limiting amplifier (LA) [2]-[7] and automatic gain controller (AGC) [8]-[10] have been used to control the magnitude of the received signal to prevent the RF receivers from saturating. Fundamentally, these architectures are based on power detection of the received signal, where input power level is used to control the gain. The strength of the incoming signal in these magnitude control architectures is conventionally detected by the received signal strength indicator (RSSI) amplifier. RSSI is a logarithmic amplifier that provides an output DC voltage to the corresponding input RF power. It can be used for monitoring and signal processing to control the gain in the RF signal chain. The logarithmic characteristic of the RSSI circuit is used to map a wide dynamic range of the signal onto a relatively limited output voltage range.

To assess and use the "best" communication channel, the RSSI circuit is deployed as a signal quality measurement tool in the RF receivers [11]. Other applications in the IoT realm include localization [12], smart storage systems [13], biomedical applications like human body communication [2], and seizure detection among others. The mandatory requirement of RSSI in the physical layer (PHY) of IEEE 802.15.4 protocol stack makes RSSI an indispensable part of the RF receivers [15].

With such a critical and integral role of the RSSI circuit in RF receivers, optimizing its key parameters such as power consumption, dynamic range, and detection accuracy is critical to the optimization of the entire RF receiver. RSSI designs in the literature for various applications have reported dynamic range>50 dB with detection accuracy ranging from ±1 to ±2 dB and power consumption in the range of few mWs [2], [3], [5], [6]. The higher dynamic range at the cost of such high power consumption is not a feasible scenario considering IoT devices are operated using small batteries. With ultra-low power (ULP) consumption, IoT devices can potentially thrive on a self-sustained energy system with energy harvesting, overcoming limitations of battery-based systems [16].

In accordance with various embodiments, an ultra-low power RSSI circuit in 65-nm CMOS technology is disclosed that directly converts the input RF power to a digital signal indicating the strength of the incoming signal. The RSSI design with a dynamic range of 26 dB and power consumption of 15 nW has high detection accuracy of ±0.5 dB, with the highest reported figure of merit (FOM) among the state-of-the-art designs. Section II discusses conventional architecture and the proposed architecture of the RSSI circuit. Section III provides the details of the circuit design. In Section IV, we provide a detailed analysis of the proposed design. Measurement results are presented in Section V. Finally, conclusions are presented in Section VI.

II. RSSI Architecture

Conventionally used "Linear-in-dB" detectors generate an output that is proportional to the logarithm of the input signal [17]. We briefly discuss the successive detection architecture (SDA), which is the common RSSI architecture. It has a relatively lower power consumption compared to the other reported architectures [6].

Figure 2:
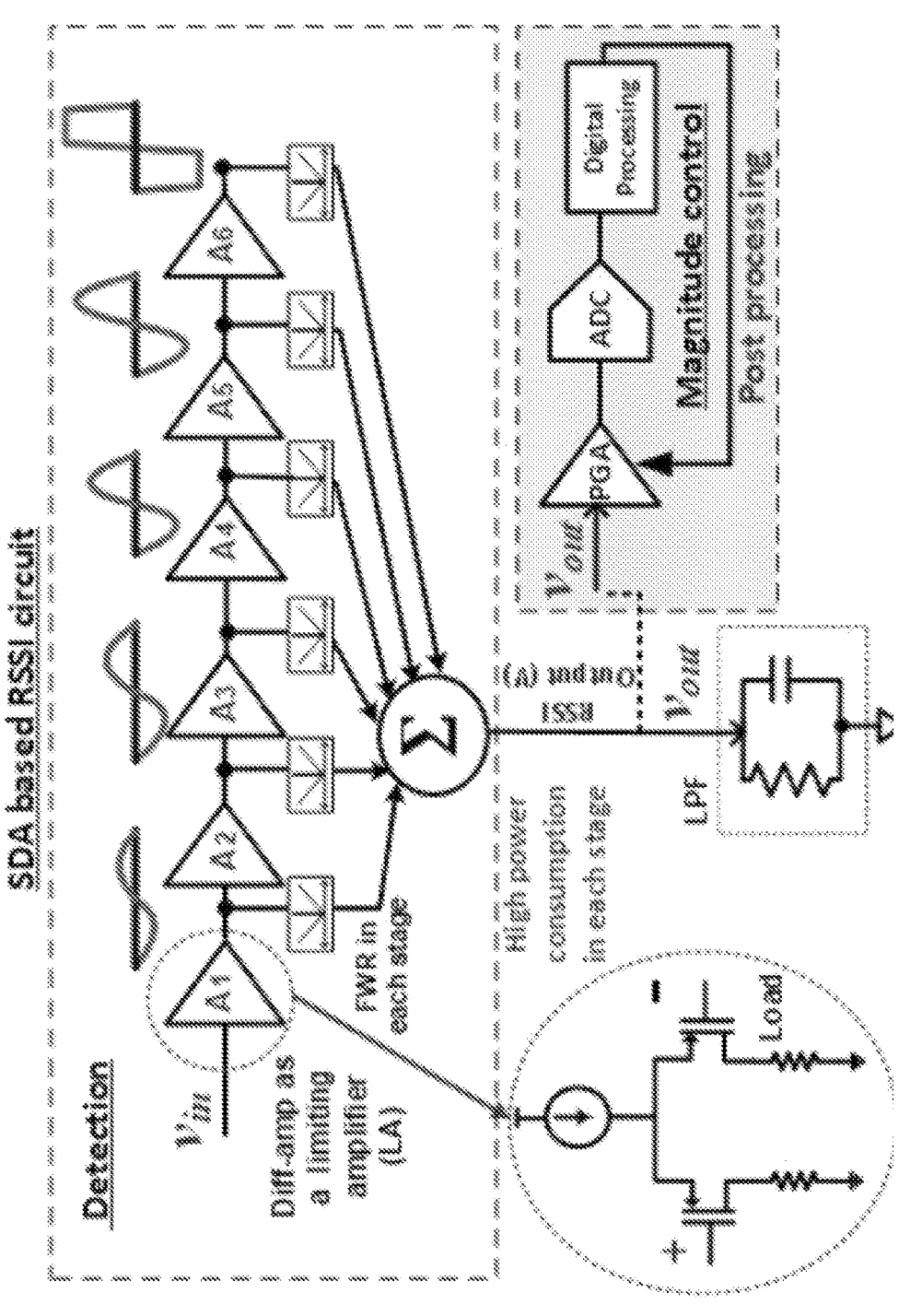
FIG. 2 is a diagram illustrating a successive detection architecture (SDA). The output is summed from all the stages to indicate the received signal strength.

FIG. 2 shows the SDA based RSSI detection, which comprises cascaded limiting amplifiers (LA) and full wave rectifiers (FWR) in each stage. The incoming signal Vin is amplified by each stage of the cascaded amplifier with a gain A. This amplified signal moves through the chain of amplifiers and the final DC output voltage corresponds to the power of the incoming signal (dBm). Eqn. (1) represents the output of the i+1$^{th}$ stage as the sum of the output of each stage and depending on the input amplitude, the output of each stage may or may not be saturated.

$$V_{out} = \sum_{i=1}^{n} A^i \cdot V_{in} \qquad (1)$$

Based on the equations of dynamic range and accuracy, which are the critical parameters of the RSSI circuit [3], we observe that increasing the number of stages (n) and the gain per stage of the limiting amplifier improves the dynamic range and the accuracy of detection.

Optimization of these parameters would lead to an increased overall power consumption for detection in addition to the area overhead. FIG. 2 also shows that the magnitude control of the incoming signal with architectures like AGC using digital signal processing step would also incur extra power consumption. The architecture in accordance with one or more embodiments has a different design over the conventional SDA based signal detection. Through a direct conversion of RF signal to a digital code, we combine the detection and processing steps at ultra-low power consumption with a lower area overhead.

A. RSSI Circuit Architecture

Figure 3A:
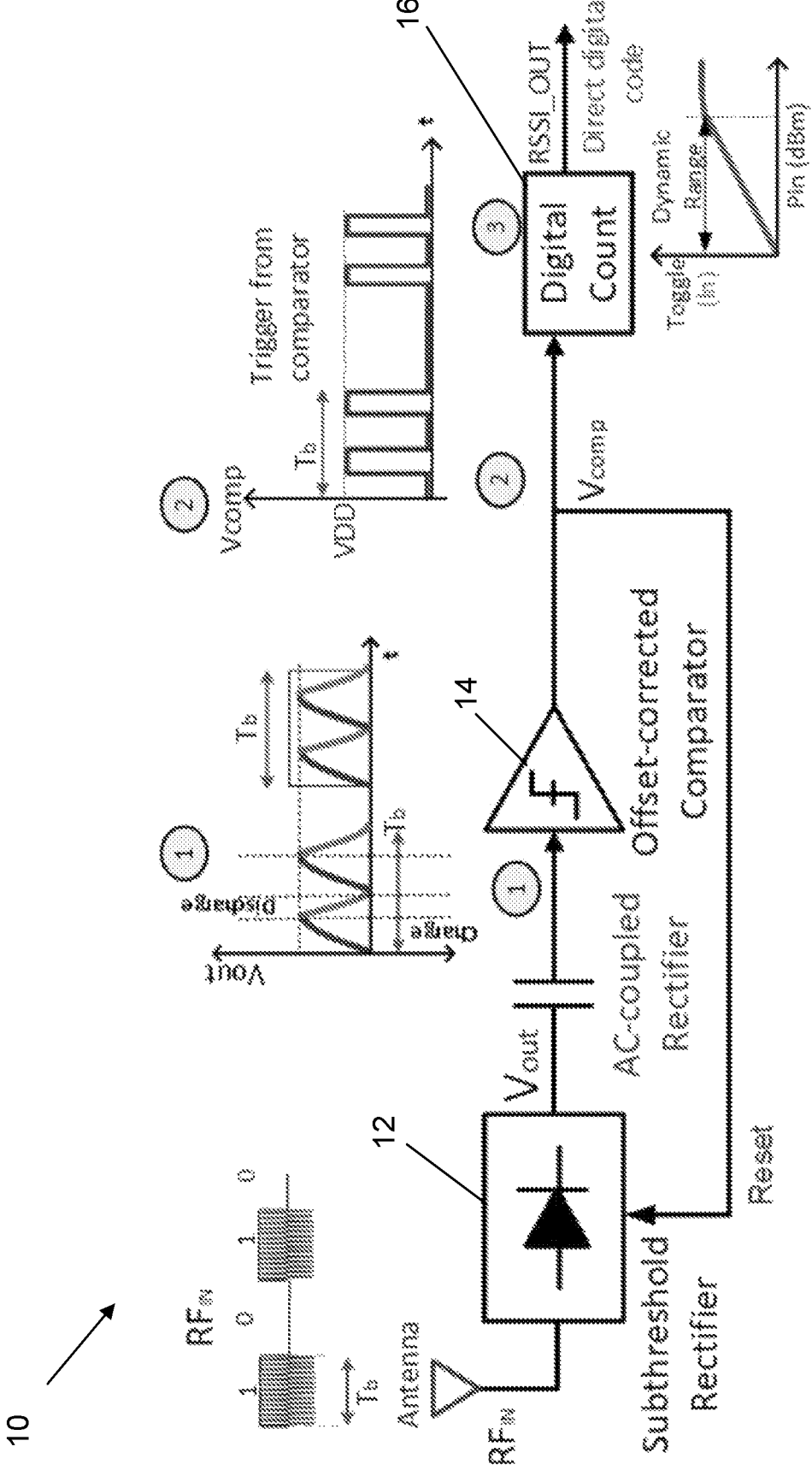
FIG. 3A is a diagram showing an architecture in accordance with one or more embodiments for directly converting an input signal power to a digital code where the number of toggles (N) vary with the incoming signal strength (dBm).
Figure 3B:
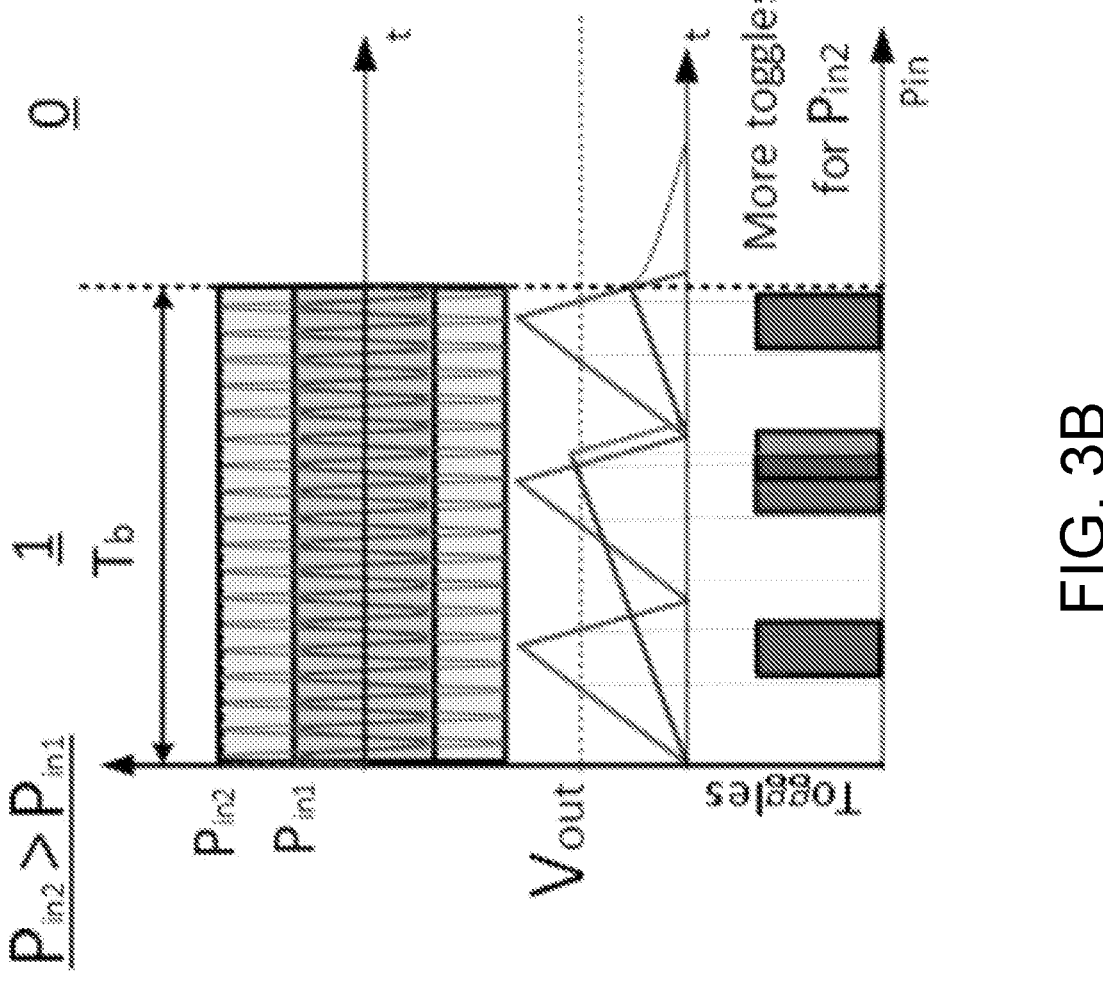
FIG. 3B shows the strength of an incoming RF signal specified by the unique signature generated in the RSSI circuit of FIG. 3A.

FIG. 3A shows the architecture of an exemplary RSSI circuit 10 in accordance with one or more embodiments. It is based on the envelope detection of the incoming signal, $RF_{IN}$, which is implemented using a multi-stage passive rectifier 12. $RF_{IN}$ is rectified and the output Vout is AC-coupled to an ultra-low power comparator 14. This output voltage of the rectifier 12 triggers the comparator 14 to generate a '0' or a '1'. The output of the comparator 14 is fed back to the multistage passive rectifier 12. Each stage of the rectifier 12 includes a discharge switch, which effectively discharges the output of the rectifier 12 by discharging each stage of the rectifier 12. Based on the control signal from the comparator 14, a discharge event happens for a 0→1 transition. In the symbol duration Tb, the incoming signal initiates another cycle, charging the rectifier output node. This again triggers the comparator 14 and leads to another cycle of the discharge. The repeated cycle of charging-discharging (toggle) of the rectifier output in the duration Tb of the incoming signal $RF_{IN}$ triggers output of the comparator 14 to '1/0' respectively and creates a unique digital signature at 16 indicating the strength of incoming signal. Thus, a higher strength signal leads to multiple charge-discharge events at the output of the comparator 14. FIG. 3B shows that for two different incoming signal strength $P_{in1}$ and $P_{in2}$, the strength of the incoming RF signal is uniquely identified by the different toggling output of the RSSI circuit 10. Similar to the conventional "Linear-in-dB" detectors, the number of toggles, in this architecture also exhibits a logarithmic characteristic with the input signal strength (in dBm). It enables a wide dynamic range input power detection with a high accuracy. The direct conversion of the input signal to a digital word in the RSSI architecture provides several benefits including the following:

1) Direct digitization of the RF Signal: The direct conversion of the signal strength to a digital code can be used to indicate and control the magnitude of the incoming signal, eliminating the need for further post processing like code word generation in AGC based architecture [10]. The proposed architecture also simplifies the design of the RF front-end especially with the direct conversion of RF signal into digital code. The direct conversion eliminates the need of analog to digital converter (ADC), which would otherwise require a higher dynamic range leading to a higher area and power overhead [18], [19].

2) Noise Resilience: To assess the accuracy of the link quality, it is important to characterize the in-band interference and the ambient channel noise. Lack of such a feature in the existing RSSI architectures challenges the RSSI as a definite link quality indicator (LQI) tool [20]. The sensitivity of the RSSI circuit 10 can characterize the in-band interference and the ambient channel noise, which can be used to set the threshold before the actual channel estimation [21].

3) Higher Accuracy: As an LQI tool, the accuracy of the RSSI circuit 10 is of high importance. In the proposed design, high accuracy is achieved in the wide dynamic range. This is advantageous for applications like localization (as shown in FIG. 1), where the detection accuracy is a critical specification [22].

4) Diverse applications: Wireless beamforming using MIMO antenna arrays is done to enable an efficient power transfer between the transmitter and the receiver. Fine tuning of the beamforming matrix for such MIMO systems based on the values of RSSI from the receiver is proposed in [12]. This application, which can lead to a significant improvement in the communication reliability, is based on the accuracy of RSSI detection. The proposed circuit with high accuracy and ultra-low power consumption enhances the viability of such novel applications by tuning the beamforming matrices using the directly generated digital code without the ADC or an off-con chip microcontroller [12]. This leads to a better Quality of service (QoS) in the realm of wireless communication.

III. Circuit Implementation

A. Rectifier

Figure 4:
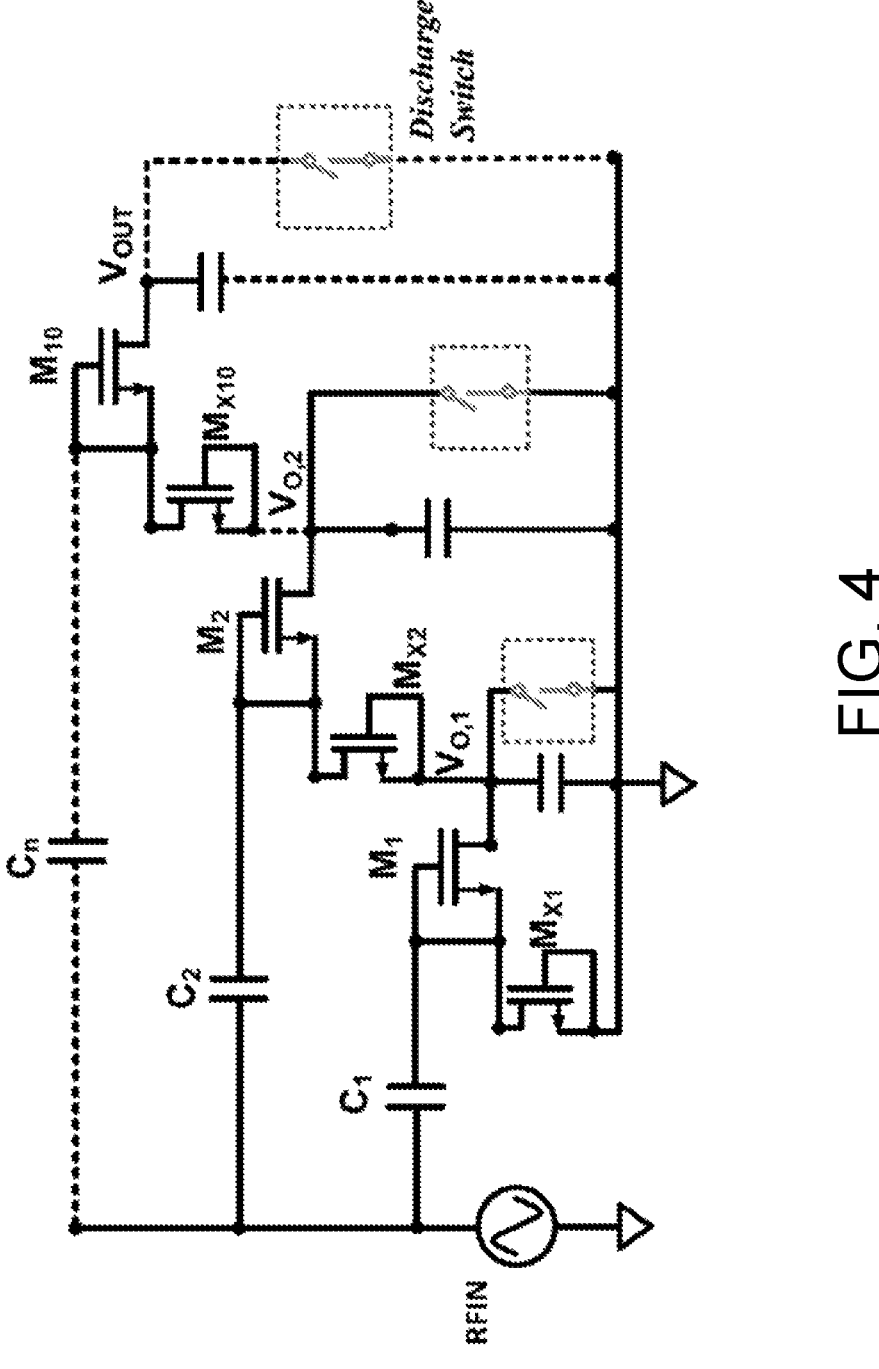
FIG. 4 is a diagram showing a modified 10-Stage Dickson based passive rectifier with a discharge switch for energy detection of the incoming RF signal.

FIG. 4 shows a modified Dickson charge pump with a multistage rectifier, which is used to perform power detection of the incoming RF signal. The output of the rectifier is a DC signal with small ripples. The input to successive stages swings on top of the DC level of the previous stage, which results in a higher output voltage. The rectifier should exhibit high voltage conversion across a wide range of the input powers in order to achieve a high dynamic range for the RSSI-based detection. FIG. 4 shows multiple half wave rectifiers cascaded to provide a higher output voltage. For the incoming signal of amplitude $V_A$, with a large dynamic range, the transistors in the diode configuration may operate either in the subthreshold or in the saturation region. For low strength signal, the transistors primarily operate in the subthreshold region. In Table I (FIG. 23), we present the device implementation details for the rectifier design.

Figures 5A, 5B, 5C:
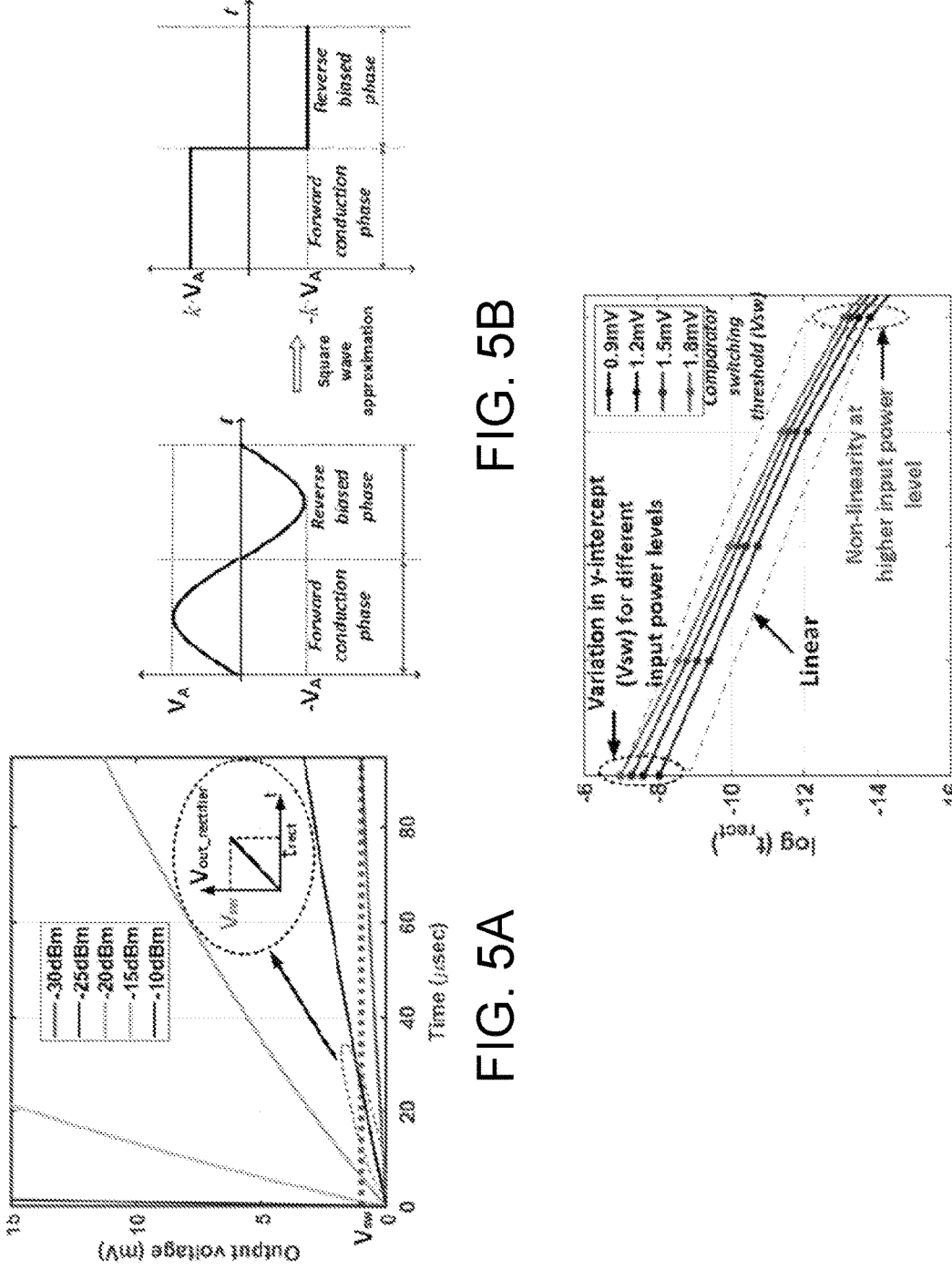
FIG. 5A is a graph that shows the output of the 10-stage Dickson charge pump for different input power levels of the RF signal.
FIG. 5B shows the square wave approximation for analysis.
FIG. 5C shows simulation results of the rectifier timing response for different switching voltages of the comparator.

1) Sensitivity: For the proposed exemplary RSSI circuit, we define sensitivity as the minimum input power (dBm) for which the circuit consistently generates at least one toggle at the output. This minimum detectable signal sets the lower limit of the dynamic range of detection. The rectifier is followed by the comparator, and hence the rectifier output voltage must reach the threshold voltage of the comparator ($V_{SW}$) within the duration of the incoming RF signal. FIG. 5A shows simulation results of the output voltage of the rectifier for different power levels marked with the switching threshold ($V_{SW}$). Although the use of passive rectifiers limits the sensitivity when compared to active rectifiers, they are instrumental in enabling the ultra-low power operation. The proposed exemplary 10-stage rectifier can detect signals at −38 dBm.

2) Timing analysis of the rectifier: The time for the rectifier output voltage to reach to $V_{SW}$ depends on several factors and a detailed analysis is presented below for the half wave rectifier and is extended to an n-stage rectifier.

In the sub-threshold region of operation, the transistor drain current is given by, $$I_D = I_S e^{(V_{GS}-V_{TH})/\eta V_t}(1-e^{-V_{DS}/V_t}) \qquad (2)$$

where $I_S$ is the sub-threshold saturation current, $\eta$ is the subthreshold ideality factor, Vt is the thermal voltage given by kT/q, $V_{TH}$ is the threshold voltage, and $V_{GS}=V_O-V_{A\,cos\,\omega t}$ where $V_O$ is the output of each stage. The DC output or average current from the rectifier can be calculated by $$I_O = \frac{1}{T}\cdot\int_0^T I_D \cdot dt \qquad (3)$$

To simplify an otherwise involved equation [23], we approximate the sinusoidal input of an amplitude $V_A$ with a square wave of amplitude $k\cdot V_A$ as shown in FIG. 5B, assuming that the scaling factor k for the square wave provides the same output power as the sinusoidal wave input. The resulting equation, assuming a square wave input, is given by, $$I_O \cong \frac{I_{ST}}{T}\cdot\int_0^{T/2} e^{(k\cdot V_A - V_O)/\eta V_t}\left(1 - e^{-(k\cdot V_A + V_O)/V_t}\right)\cdot dt - $$
$$\frac{I_{ST}}{T}\cdot\int_{T/2}^T e^{(0)/\eta V_t}\left(1 - e^{-(k\cdot V_A + V_O)/V_t}\right)\cdot dt$$

where $I_{ST}=I_S\cdot e^{-V_{TH}/\eta V_t}$, and $V_{GS}=0$ during the reverse bias phase. The equation resolves to $$I_O = \frac{I_{ST}}{2}\left[e^{(k\cdot V_A - V_O)/\eta V_t}\left(1 - e^{-(k\cdot V_A + V_O)/V_t}\right) - 1\right] \qquad (4)$$

For $kV_A \gg V_0$ $\qquad (5)$ $$I_O = \frac{I_{ST}}{2}\left[e^{(k\cdot V_A/\eta V_t)}\left(1 - e^{-(k\cdot V_A/V_t)}\right) - \frac{I_{ST}}{2}\left((1 - e^{(-k\cdot V_A/V_t)})\right)\right] \qquad (45)$$

$$I_O = \frac{I_{ST}}{2}\left(e^{k\cdot V_A/\eta V_t} - 1\right)$$

At lower input powers with k<1 and $\eta$>1.2, $kV_A \ll \eta Vt$. $I_O$ using Taylor's expansion can be written as $$I_O \cong \frac{I_{ST}}{2}\cdot\left(\frac{k\cdot V_A}{\eta V_t}\right) \qquad (6)$$

Time required ($t_{stage}$) for the rectifier output (single stage) to reach the switching voltage of comparator $V_{SW}$, $$\int_0^{V_{sw}} C\cdot dV = \int_0^{t_{stage}} I\cdot dt$$
$$t_{stage} = \left(\frac{2\cdot C\cdot V_{sw}\cdot\eta\cdot V_t}{I_{ST}\cdot k}\right)\cdot(V_A)^{-1}$$

For n-stage rectifier, $$t_{rect} \cong \left(\frac{2\cdot C\cdot V_{sw}\cdot\eta\cdot V_t}{I_{ST}\cdot k\cdot k'}\right)\cdot(V_A)^{-1}$$

where k' represents the scaling factor of the n-stage rectifier.

For the conventional n-stage Dickson charge pump, $k'\approx n$, when the rectifier output reaches the maximum open circuit voltage. In our modified rectifier, $k'<n$, as the output charges only up to $V_{SW}$. Therefore, we can rewrite $t_{rect}$ as $$\ln(t_{rect}) = -(A\cdot P_{in} + B) + \left[\ln\left(\frac{2\cdot C\cdot V_{sw}\cdot\eta\cdot V_t}{I_{ST}\cdot k\cdot k'}\right) + \frac{V_{TH}}{\eta V_t}\right] \qquad (7)$$

where $P_{in}$ is in dBm and A and B are the constants to convert $V_A$ to $P_{in}$ (dBm). Several important conclusions can be drawn from Eq. 7 that give an insight on the design of rectifiers operating in the sub-threshold region. First, $t_{rect}$ is an exponential function of $V_A$, which is an important result, as we later show a linear relation between the number of toggles (ln N) and the input power (dBm). The negative slope is an anticipated result as rectifier time ($t_{rect}$) must decrease with increasing input voltage. Second, based on the above analysis we see from Eq. 7, the threshold voltage variation does not affect the slope of the curve and it can be corrected in the initial calibration along with the temperature dependent term ($V_{TH}/\eta Vt$). To confirm the above analysis, we present simulations of the rectifier response time at different input power levels in FIG. 5C. The variation in the switching voltages changes the y-intercept while the slope of the curve remains the same in accordance with Eq. 7. At higher input power levels, the transistors shift from sub-threshold to saturation region of operation, which imparts a non-linear characteristic and limits the dynamic range of detection. Under this constraint, we discuss the techniques to extend the dynamic range in Section V.

3) Noise analysis of the rectifier: The sensitivity of the rectifier can be limited by the noise from the rectifier. If the noise of the rectifier exceeds the minimum detectable signal level of the rectifier, it will affect the overall sensitivity of the rectifier, which limits the dynamic range of input signal power detection. The noise simulation shown in FIG. 6A reveals that the noise from the rectifier alone is high enough to trigger the comparator, which may lead to detection inaccuracies from the undesired toggling of the output node of the RSSI circuit.

Figures 6A, 6B, 6C:
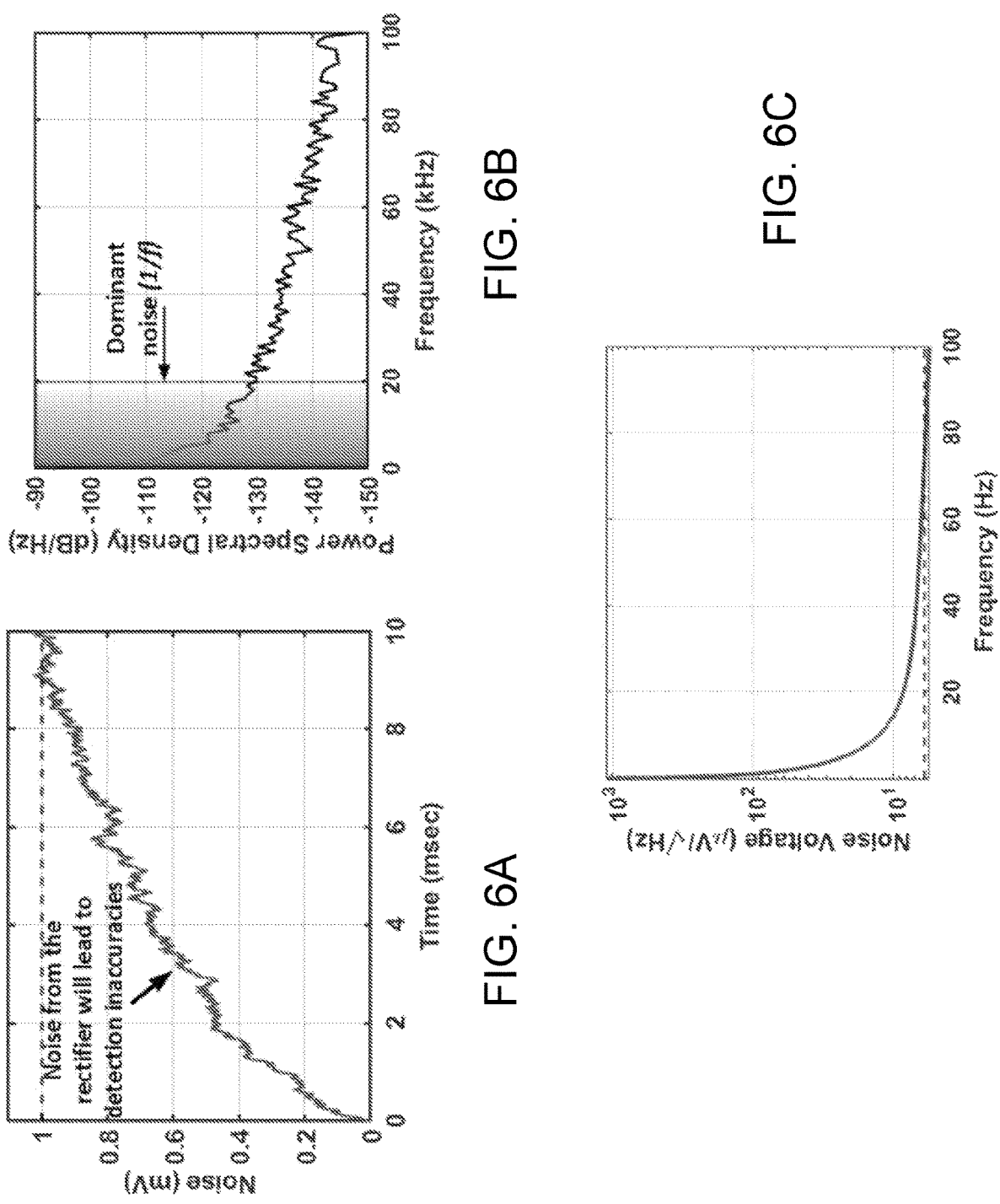
FIG. 6A shows a transient noise analysis of the rectifier, where a high value can trigger the comparator.
FIG. 6B shows a power spectral density (PSD) plot of the noise.
FIG. 6C shows the noise is dominant in the low frequency region.

As shown in FIG. 6B, the noise from the rectifier is dominant in the lower frequency range ($\approx$100 Hz). From FIG. 6C, we see that the magnitude of noise reaches to 1 mV in the lower frequency range$\approx$1 Hz. To mitigate the effects of this low frequency noise, we have implemented a low frequency noise cancellation circuit in the feedback loop of the comparator. The design details of noise cancellation are discussed in Section III-(B).

B. Comparator

Figures 7A, 7B:
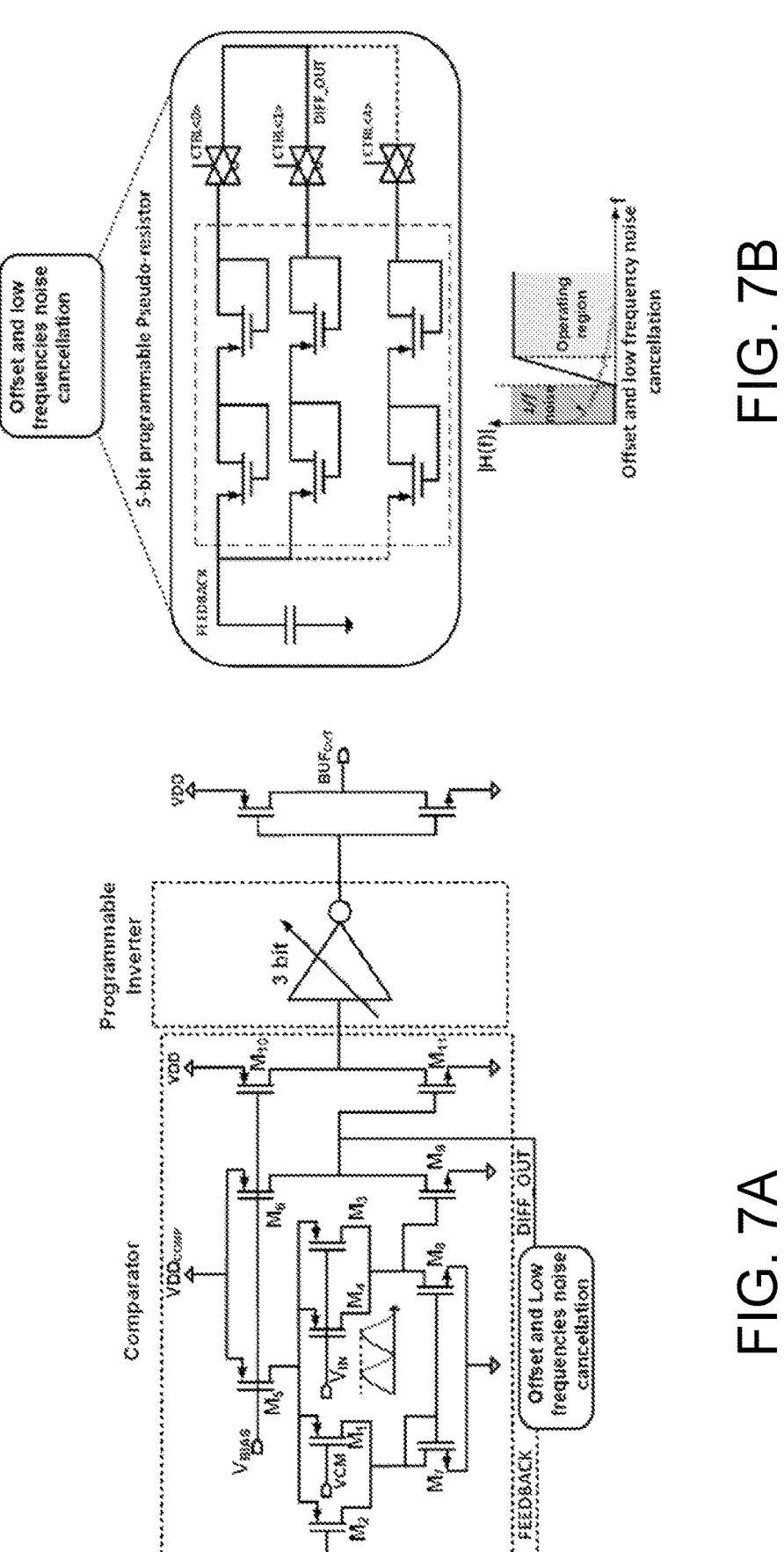
FIG. 7A shows an ultra-low power comparator design schematic.
FIG. 7B shows a DC offset and low frequencies noise cancellation circuit.

FIG. 7A presents the schematic of the comparator, which is a differential amplifier followed by a common source stage. Transistors M3-M4 are used to sense the output voltage of the rectifier ($V_{IN}$) and transistor M1 is held at the common-mode level. The bias current of the comparator is 7 nA, which includes bias for diff-amp stage and programmable inverter. In Table II (FIG. 24), we present the device implementation details for the comparator design. The comparator is triggered by the output of the rectifier, with switching threshold as labelled in FIG. 5A. A tunable switching threshold for the comparator is implemented with a 3-bit programmable inverter, which can also aid in dynamic range enhancement. To improve the precision of the detection, we have implemented a configurable negative feedback circuit in the comparator, which alleviates the sources of error.

1) Feedback circuit: The device mismatch in the comparator generates non-ideal effects resulting in an input referred offset voltage. This input referred offset voltage can lead to significant accuracy errors in the detection of signal strength. Another source of error is the noise from the rectifier (dominant at low frequencies), which was discussed in Section III-(A). From FIG. 6A, we observe that the integrated noise is sufficiently high ($\approx$1 mV) at lower frequency to trigger the comparator even in the absence of an incoming signal. This would lead to an incorrect toggle from the comparator, introducing inaccuracies in the detection. By using a first order low pass filter in the feedback loop of comparator as shown in FIG. 7B, we can correct for both DC offset and the dominant 1/f noise from the rectifier.

The closed loop frequency response of comparator is given by, $$A(s) = \frac{V_0(s)}{V_{in}(s)} = A_0 \cdot \frac{(s\tau_z + 1)}{(s\tau_{p1} + 1) \cdot (s\tau_{p2} + 1)} \tag{8}$$

where $A_0$ represents the small signal gain and $\tau_{p1}^{-1}$ and $\tau_{p2}^{-1}$ represent the output poles of the differential amplifier and the CS stage respectively. The feedback network introduces a zero $\tau_{z1}^{-1}$ in the frequency response. This zero $(\tau_{z1}^{-1})$, cancels the sources of errors limited to low frequencies and also improves the stability of the circuit.

Figures 8A, 8B:
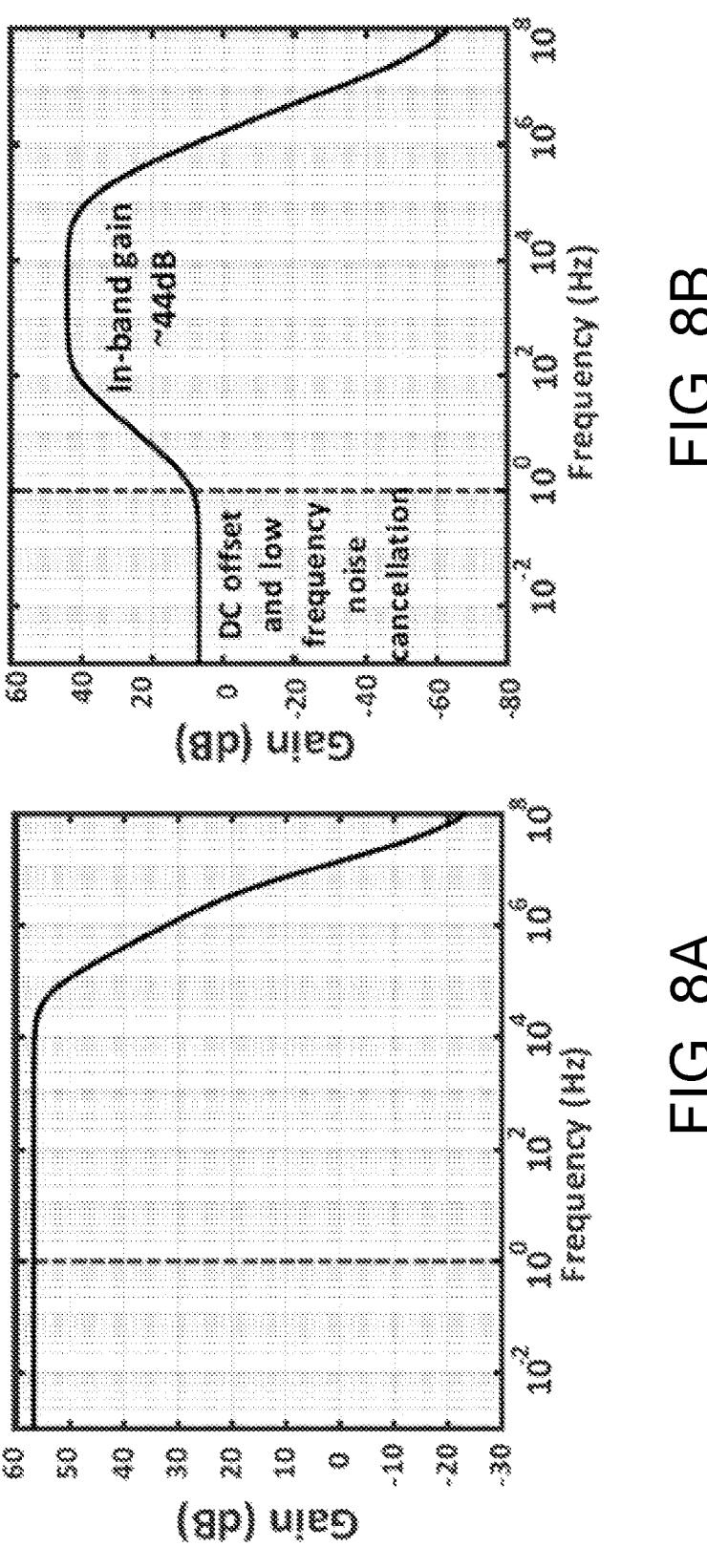
FIG. 8A shows simulation results for an open-loop response of the comparator.
FIG. 8B shows simulation results for a closed loop response with offset-noise correction feedback loop.

FIG. 8A shows the simulation result for the open loop frequency response of the comparator. In FIG. 8B, we show the simulation result for the response of the comparator with the feedback loop. The comparator with the feedback loop shows a flat band gain of 44 dB, 3 dB bandwidth of $\approx$60 KHz, and 0 dB bandwidth of $\approx$1 MHz. The attenuating behavior of the comparator at low frequencies removes the effects of the DC offset and 1/f noise from the rectifier. It should be noted that the feedback loop does not attenuate the incoming signal in the range of interest (a few kHz to MHz).

Figure 9B:
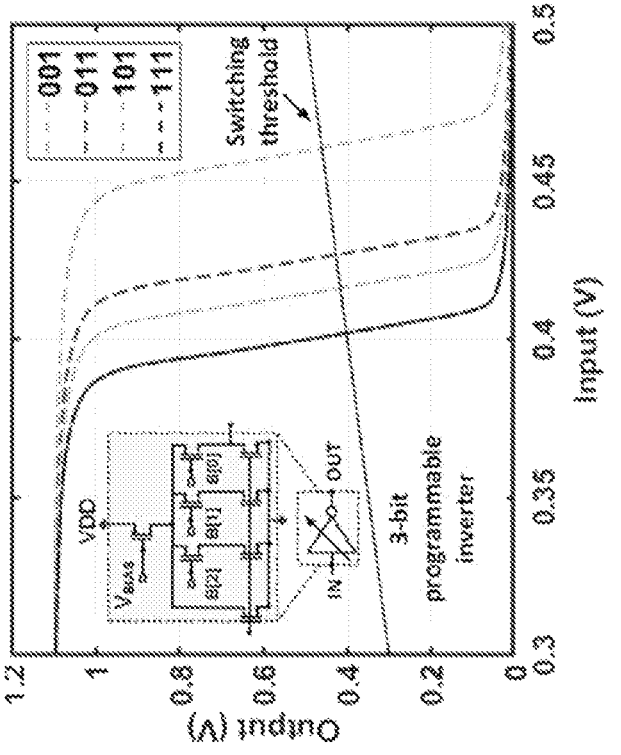
FIG. 9B shows a 3-bit programmable inverter.
Figure 9A:
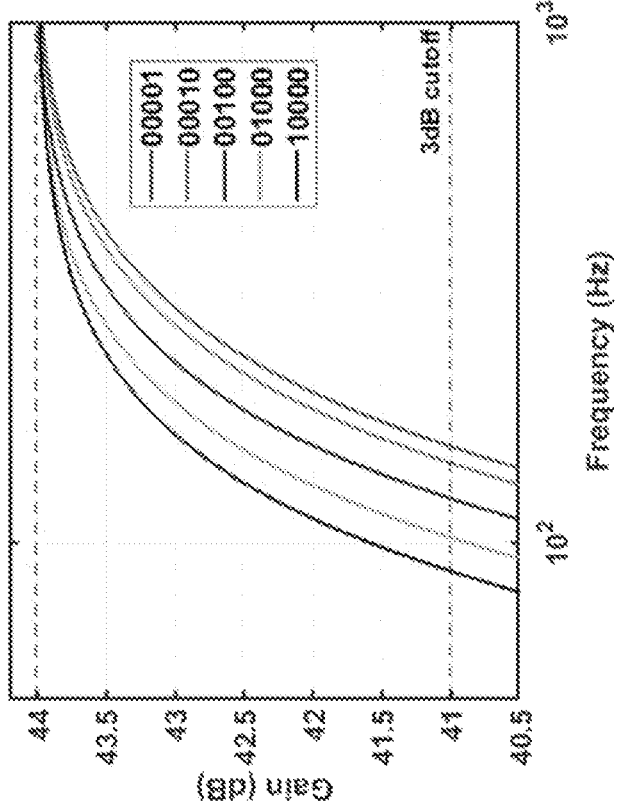
FIG. 9A shows different cut-off frequencies achieved by a 5-bit programmable pseudo-resistor based feedback network.

To cancel the low frequency signals in the order of hundreds of Hz would require a significantly high value of resistor in the low pass filter based feedback network. With a capacitance of 10 pF realized using an on-chip metal-insulator-metal (MIM) capacitor, we would require a resistance of $\approx$1-10 G$\Omega$s. The requirement of such a high resistance is practically infeasible if realized on-chip with a poly-silicon based resistor. Pseudo-resistor [24], which is essentially a MOS transistor connected in the diode topology can present a high resistance and is an alternate way to realize high on-chip resistors. Although, pseudo-resistor as a simple topology can achieve such values of resistance, process variation affects its resistance value significantly. To account for the process variability of the pseudo-resistor based topology, we have implemented a 5-bit tunable pseudo-resistor network achieving different cut-off frequencies as shown in FIG. 9A. This one time setting of the cut-off frequency is a part of the initial calibration setup of the RSSI circuit. Using this tunable setup, we can control a variation of more than 2$\times$ in the value of the pseudo-resistor.

2) Programmable Inverter: We remove device mismatch related offset from the comparator because it can cause a large variation in the comparator's switching threshold. However, a 0-offset comparator can start toggling due to noise. The switching threshold of the comparator therefore is made tunable with the following 3-bit programmable stage inverter to keep it above noise. FIG. 7A shows the inverter, which can have a small influence on the comparator's switching threshold. In FIG. 9B, we show that a tunability range of up to 100 mV in the switching threshold of the inverter can be achieved with different settings of the programmable inverter. This translates to a tunable switching threshold control of up to 0.5 mV at the comparator input. Along with the offset and low frequencies noise correction in the comparator, the programmable inverter in different settings can be used to control switching threshold of the comparator to correct for any additional noise. This additional correction is part of the initial calibration process.

3) Timing analysis: To assess the relationship between the propagation delay of the comparator and the incoming signal strength, a detailed timing analysis is presented below. In the system transfer function from Eq. 8, Vin is the output of the rectifier AC-coupled to the input of the comparator. Output of the rectifier (Vout) is approximately a ramp function as shown in FIG. 5A (inset) and can be represented as, $$V_{out}(t) = \frac{V_{sw}}{t_{rect}} \cdot t \tag{9}$$

where $t_{rect}$ is the time to reach the switching voltage $V_{sw}$ of the comparator and is calculated from Eq. 7. From Eq. 8 and 9, simplifying the response of the comparator to this ramp input using partial fraction, we get $$V_o(s) = \frac{V_{sw}}{t_{rect}} \cdot \frac{1}{s^2} \left( \frac{A_0}{\tau_{p2} - \tau_{p1}} \right) \left[ \left( \frac{\tau_z - \tau_{p1}}{s\tau_{p1} + 1} \right) + \left( \frac{\tau_{p2} - \tau_z}{s\tau_{p2} + 1} \right) \right]$$

Using the power expansion series of $e^x$, the output of the comparator in the time domain is given by $$V_0(t) = \frac{V_{sw}}{t_{rect}} \cdot \frac{A_0}{\tau_{p2} - \tau_{p1}}$$

$$\left( (-K_1\tau_{p1} - K_2\tau_{p2}) + K_1 t + K_2 t + \left( K_1\tau_{p1}e^{-t/\tau_{p1}} + K_2\tau_{p2}e^{-t/\tau_{p2}} \right) \right)$$

$$V_0(t) = \frac{V_{sw}}{t_{rect}} \cdot \frac{A_0}{\tau_{p2} - \tau_{p1}} \left[ (-K_1\tau_{p1} - K_2\tau_{p2}) + \right.$$

$$\left. (K_1 + K_2)t + K_1\tau_{p1}\left(1 - \frac{t}{\tau_{p1}} + \frac{t^2}{\tau_{p1}^2}\right) + K_2\tau_{p2}\left(1 - \frac{t}{\tau_{p2}} + \frac{t^2}{\tau_{p2}^2}\right) \right]$$

The propagation delay of the inverter tp is given by, $$V' = \frac{V_{sw}}{t_{rect}} \cdot t_p^2 \cdot A_0 \left( \frac{\tau_z}{\tau_{p1} \cdot \tau_{p2}} \right)$$

where V' is the voltage at 50% of the transition. Substituting the value of $t_{rect}$ from Eq. 7. we get $$t_p = \sqrt{\left(\frac{2V' \cdot C \cdot n}{A_0 \cdot I_{ST}}\right) \cdot \left(\frac{\tau_{p1} \cdot \tau_{p2}}{\tau z}\right) \cdot e^{kV_A/\eta V^T}} \quad (10)$$

$$\ln(t_p) = -\frac{1}{2}\frac{k \cdot V_A}{\eta V_T} + \frac{1}{2}\ln\left(\frac{2V' \cdot C \cdot \tau_{p1}\tau_{p2} \cdot n}{A_0 \cdot I_S \cdot \tau_z}\right) + \frac{V_{TH}}{\eta V_T}$$

From Eq. 10, we see that the comparator delay is an exponential function of the input voltage VA. Similar to our analysis of the rectifier, the process variation parameters can be handled during the initial calibration setup. Although our analysis has established a linear relation between ln(tp) and input power (dBm), we later show in Section IV that the magnitude of the comparator delay does not have a significant impact on the toggling rate of the RSSI output.

C. Discharge Circuit

Figure 10:
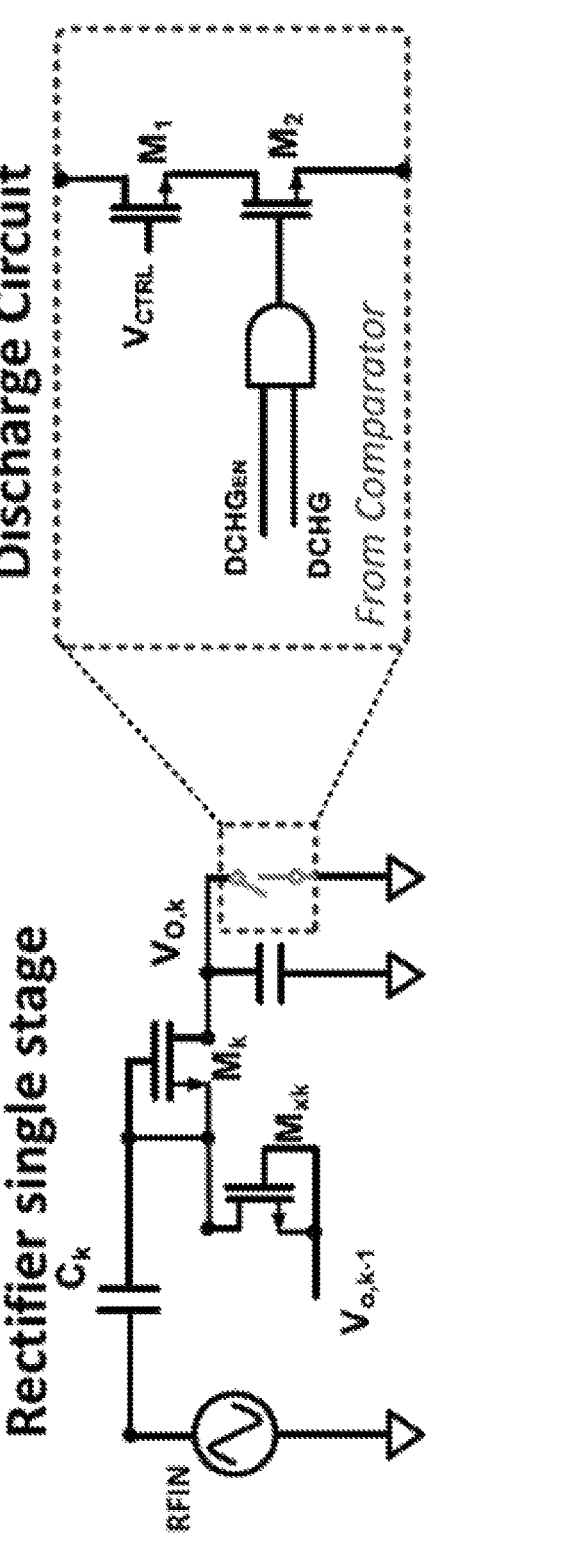
FIG. 10 shows a discharge switch triggered by the comparator output included in each stage of the rectifier for a faster discharge of the rectifier output.

To discharge the output of the rectifier based on the trigger from the comparator, a discharge switch as shown in FIG. 10, is incorporated in all stages of the 10-stage rectifier. The discharge switch has transistors M1 and M2 in the cascode configuration where voltage $V_{CTRL}$ is the gate voltage of M1, M2 and is controlled by the gated signal DCHG and external signal $DCHG_{EN}$. $DCHG_{EN}$ is the output of the comparator, intentionally slewed to prevent charge-feedthrough issues from quick successive transitions of the comparator output. $DCHG_{EN}$ is asserted when we need to perform the RSSI based detection. To enable a faster discharge of the multi-stage rectifier, this discharge switch is included in each stage of the rectifier to discharge the rectifier completely without any residual charge.

1) Timing analysis: The discharge time of the rectifier through the discharge switch affects the toggle time and a simplified timing analysis is presented below.

The discharge time of the rectifier output ($t_{dis}$) is given by, $$t_{dis} \propto R_{on} \cdot C = K' \cdot R_{on} \cdot C$$

where Ron represents the resistance of the discharge switch and C represents the rectifier load. K' represents the proportionality factor. The resistance of the discharge switch when $DCHG_{EN}$ is asserted, is given by, $$R_{on} = \frac{L}{\mu_n C_{ox} W(V_{GS} - V_{TH} - V_{DS})}$$

where $V_{DS}$ is the single stage rectifier output.

$$R_{on} = K_1 \cdot \left(1 - \frac{V_{DS}}{V_{GS} - V_{TH}}\right)^{-1}$$
$$= K_1 \cdot (1 + K_2 \cdot V_{out})$$

where $K_1 = \left(\mu_n C_{ox} W/L\right)^{-1}$ and $K_2 = (V_{GS} - V_{TH})^{-1}$ With the power expansion and neglecting higher order terms $$R_{on} = K_1 \cdot \left[1 + K_2 \cdot \left(\frac{I_{ST}}{2 \cdot C} \cdot e^{k \cdot V_A/\eta V_t} \cdot t_{rect}\right)\right]$$

$$t_{dis} = K' \cdot K_1 \cdot \left[C + K_2 \cdot \left(\frac{I_{ST}}{2} \cdot e^{k \cdot V_A/\eta V_t} \cdot t_{rect}\right)\right]$$

-continued $$\approx \left(K' \cdot K_1 \cdot K_2 \cdot \frac{I_{ST}}{2} \cdot e^{k \cdot V_A/\eta V_t} \cdot t_{rect}\right)$$

Substituting the result of $t_{rect}$ from Eq. 7 and simplifying $$\ln(t_{dis}) = \ln(K' \cdot K_1 \cdot K_2 \cdot C \cdot V_{sw})$$

This expression presents the discharge time as nearly constant timing arc for lower power. For higher power, the shift of the operating region of the rectifier to saturation region leads to an increase in the discharge time but still remains proportional to the incoming signal strength. This is discussed in more detail in Section IV.

IV. Analysis

A. Toggle Rate Calculation

Figures 11A, 11B, 11C:
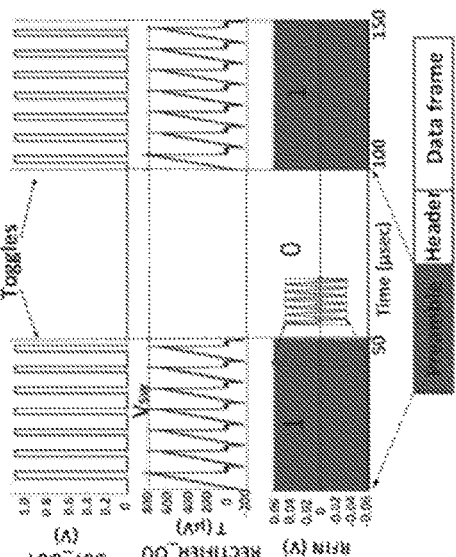
FIG. 11A shows simulation results of relation of different timing arcs with the input power for the RSSI circuit. The overall timing $t_{toggle}$ mainly depends on $t_{rect}$.
FIG. 11B shows simulation result of the number of toggles at the RSSI output for different input powers presenting "Linear-in-dB" characteristics.
FIG. 11C shows simulation results of a simplified scenario of signal estimation for the proposed RSSI circuit with an input power of −20 dBm. The output toggles correspond to the input signal strength.

The toggling rate is calculated based on the timing delay of the entire path, i.e., charge-discharge path of the rectifier output. Through our analysis we have shown that different timing arcs vary exponentially with the input signal strength. This is confirmed by the simulation results presented in FIG. 11A, showing a logarithmic relation between these timing arcs and the input power. For the discharge time, we see that $\ln(t_{dis})$ is constant for lower powers and varies linearly at higher power.

The total time for a single toggle is given by $t_{toggle}$ $$t_{toggle} = t_{rect} + t_p + t_{dis}$$

Based on the results in Eq. (7), (10) and simulation results in FIG. 11A, we see that for lower powers, $t_{rectifier} \gg (t_p, t_{dis})$. This simplifies the number of toggles of the RSSI output as, $$N = \frac{T_b}{t_{rect} + t_p + t_{dis}}$$
$$\approx \frac{T_b}{t_{rect}}$$

Substituting the value of $t_{rect}$ from Eq. 7, we obtain $$\ln(N) = (AP_{in} + B) + \left[\ln\left(\frac{T_b I_S k' k}{2CV_{sw}\eta V_t}\right) - \frac{V_{TH}}{\eta V_t}\right] \quad (11)$$

This can be further simplified as, $$\ln(N) = \alpha P_{in} + \beta \quad (12)$$

where $\alpha$ and $\beta$ represent the slope and the y-intercept of the line respectively. Thus, with a logarithmic relation between N and the input power (dBm), our proposed circuit presents "Linear-in-dB" characteristics. The simulation results presented in FIG. 11B confirm our analysis.

B. RSSI Protocol

According to 802.15.4 standard [15], the PHY layer of the radio must provide an estimate of the received signal power indicated by an integer value. The signal strength is generally observed between PCLP (Physical Layer Convergence Protocol) preamble and PLCP header. The requirement of clear channel assessment (CCA) routine to be performed prior to data transmission, carrier sense (CS) routine for signal evaluation on specific channel, and in case of mobility management a decision to connect to a specific access point (AP) based on received signal strength, imparts a necessary existential feature to the RSSI circuit [21]. Considering channel state estimation, the transmitter sends the packets, and the RSS sensor collects and monitors the RSSI value at a low data rate like 100 packets per second [11], [25]. The process of transmission, collection, and monitoring is repeated for different transmission powers accordingly.

In FIG. 11C, we show simulation results of a simplified scenario of signal estimation, wherein RSSI detection is performed during the preamble state of packet transmission at a transmit power of –20 dBm using on-off keying (OOK) based the incoming signal, the proposed architecture generates a toggling pattern as the output, which is directly correlated with the signal strength. Based on the toggle value, the RSSI value can be reported directly in dBm, which can be used for applications like link quality estimation, localization etc. Even though RSSI based detection is generally performed with low bit rates, the proposed architecture supports a bit rate of 0.1 kbps-100 kbps, and hence can implement even a faster channel state estimation.

V. Measurement Results

A. Measurement Setup

Figure 12:
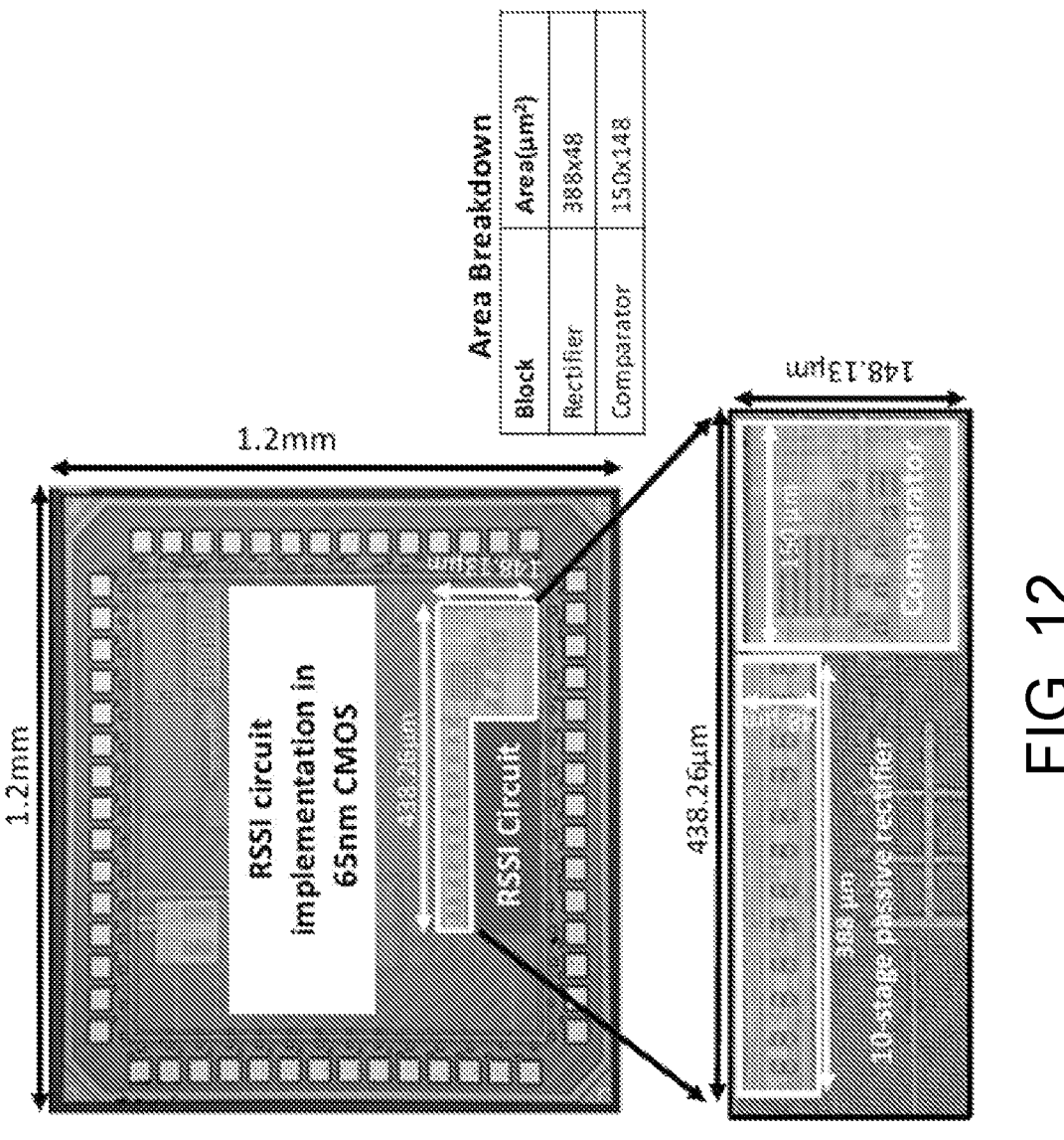
FIG. 12 shows a Die Micrograph of the RSSI circuit implementation in a 65-nm CMOS process.

The proposed circuit is designed in a 65-nm CMOS process. FIG. 12 shows the die micrograph with an area breakdown of different blocks. The die is encapsulated in a Quad Flat No-Leads (QFN) package. Our proposed RSSI circuit is energy detection based and performs detection in amplitude modulation schemes like OOK, which is a more commonly used modulation to assess the link quality in applications like ULP wake up receivers (WRX) [26]. We performed measurements on the RSSI circuit to characterize its sensitivity, dynamic range, noise performance, and power consumption. The setup and results for these measurements are discussed below.

Figure 14:
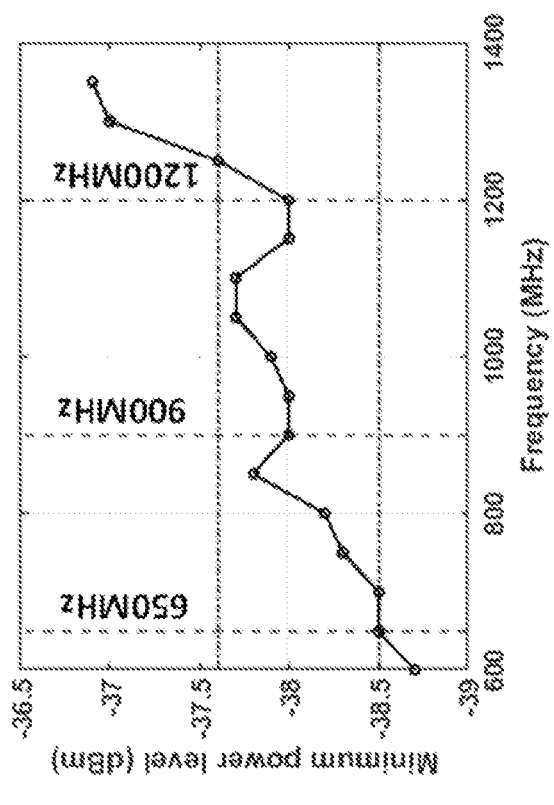
FIG. 14 shows measurement of sensitivity of the RSSI circuit from 600 MHz to 1:35 GHz. The sensitivity of the circuit at 900 MHz is −38 dBm.
Figure 13:
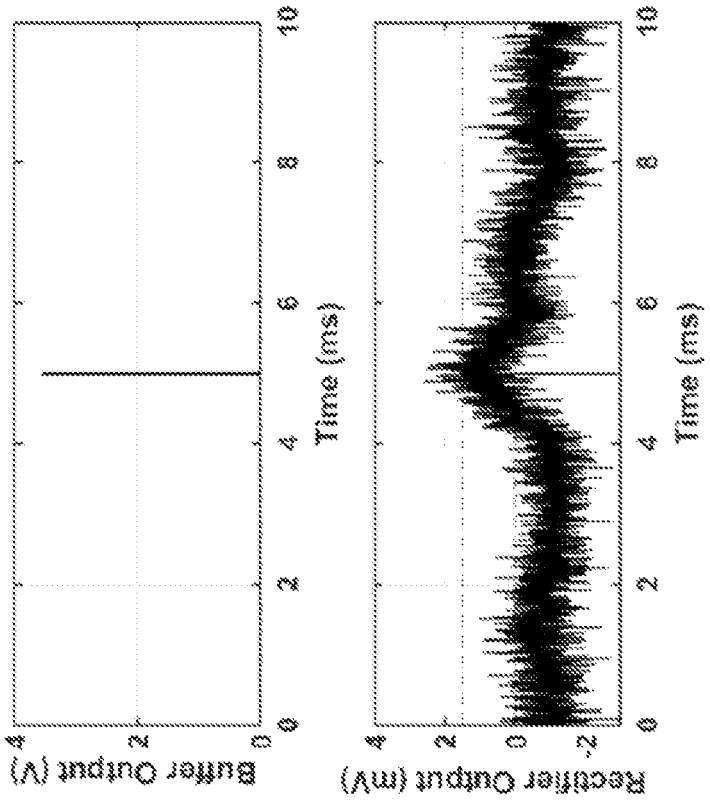
FIG. 13 shows measurement results showing single toggle of the comparator when rectifier output charges to 1 mV for −38 dBm input power OOK modulated at 900 MHz.
Figure 16:
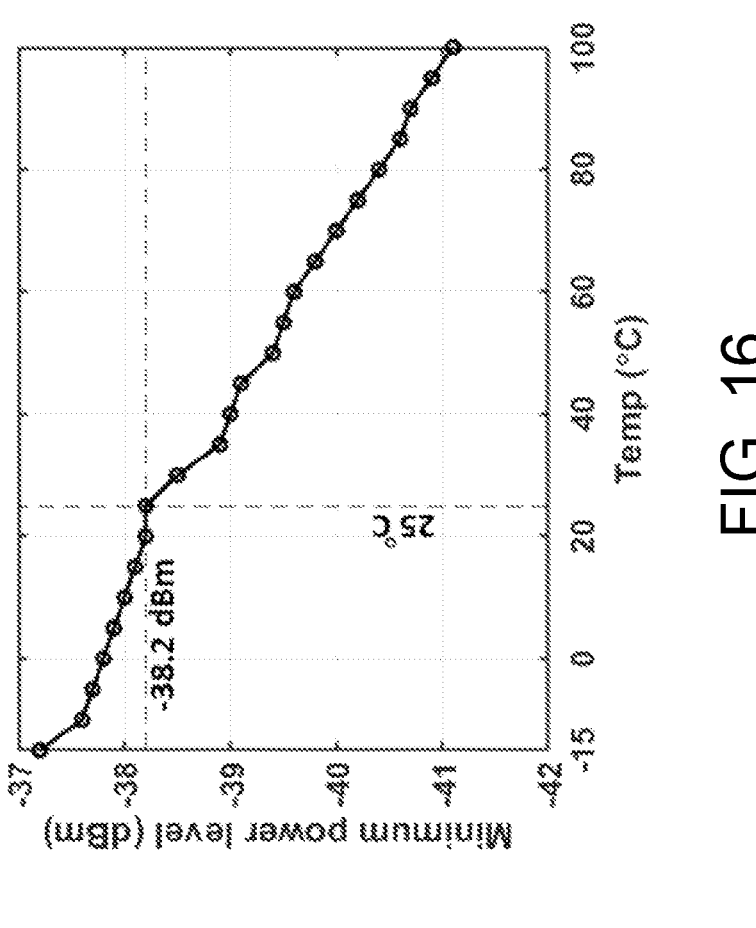
FIG. 16 shows measurement results showing the sensitivity variation across a temperature range of −15° C. to 100° C.
Figure 15:
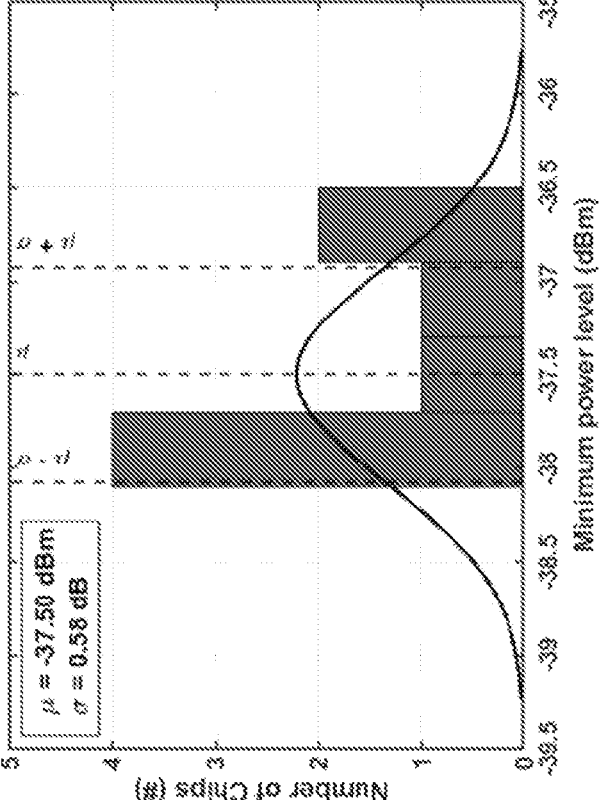
FIG. 15 shows measurement of sensitivity of the RSSI circuit across 8-different chips.

1) Sensitivity Measurements: The losses due to cable, impedance mismatch is de-embedded by performing insertion loss measurements. The measured insertion loss is ≈3 dB at 900 MHz. Considering the insertion loss of 3 dB, the minimum detectable signal (sensitivity) for the proposed RSSI circuit is –38 dBm. FIG. 13 shows the basic measured transient output of our RSSI circuit. It shows a single toggle response to a slowly rising rectifier output with –38 dBm input power, OOK modulated at 900 MHz. The comparator toggles when the rectifier output reaches ≈1 mV. This result also validates the offset-correction method used in our design. An uncompensated rectifier would not respond to the 1 mV input voltage due to inherent offset. FIG. 14 shows the sensitivity measurement result for a broad range of frequencies (600 MHz-1.35 GHz). The sensitivity of the RSSI circuit varies from ≈–39 dBm at 600 MHz to –37 dBm at 1.3 GHz. The circuit achieves a sensitivity of –38 dBm from 900 MHz to 1.2 GHz. We also characterized the sensitivity of the RSSI circuit across 8-different chips. FIG. 15 shows this measurement. A mean (μ) sensitivity of –37.5 dBm is achieved with a standard deviation (σ) of 0.58 dB. To characterize the variation of sensitivity with temperature, we measured the sensitivity of the circuit for a temperature range of –15° C. to 100° C. FIG. 16 shows the variation in the sensitivity across this temperature range. The sensitivity of the RSSI circuit is ≈–38 dBm at room temperature.

2) Dynamic Range Measurement: The measurement is done for a symbol duration of 10 ms (at 10% duty cycle, i.e., high for 1 ms) during which the toggle at the RSSI output is recorded and the measurement is repeated for different power levels at 900 MHz. Although the proposed RSSI circuit works for a broad frequency spectrum (FIG. 14), in FIG. 17A we present the measurement results for the dynamic range at 900 MHz, a frequency band of growing importance [27], [28]. From the measurement plot, we see that the circuit presents "Linear-in-dB" characteristics a dynamic range of 26 dB with an accuracy of ±0.5 dB. We report an accuracy of ±0.5 dB, which serves as a great advantage in link quality estimation in addition to other applications like localization, transmission power control, wireless beamforming etc. At higher power of the incoming signal, the shift of operational mode of rectifier from sub-threshold region to saturation region saturates the output, thus the RSSI output remains high.

To improve the dynamic range at higher input power, different techniques like capacitor attenuation array [7], [29], selective stage control of limiting amplifier [30], power selection control bits [31], multiple RSSI circuits are generally used. It should be noted that our proposed RSSI circuit is fully monolithic and no external off-chip components have been used, external off-chip components like capacitor attenuation array, which effectively prevents saturation at higher input power levels, would prove advantageous in increasing the dynamic range. In [26], authors report a RSSI circuit with a dynamic range of 25 dB to support RSSI and CCA for link quality measurements.

Figure 17B:
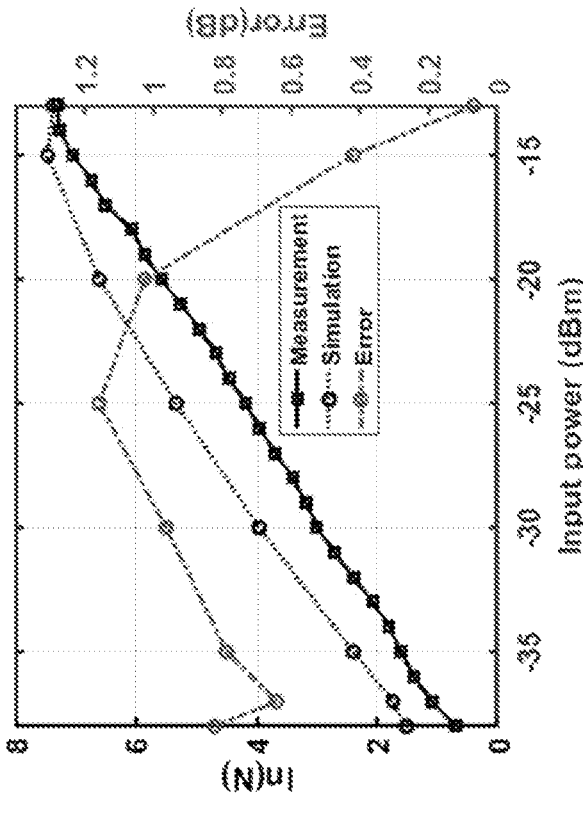
FIGS. 17A and 17B show measurement results of an RSSI circuit in accordance with one or more embodiments implemented in a 65-nm CMOS process. Linear-in-dB characteristics of the proposed circuit with a detection accuracy of ±0.5 dB over a 26 dB dynamic range.
Figure 17A:
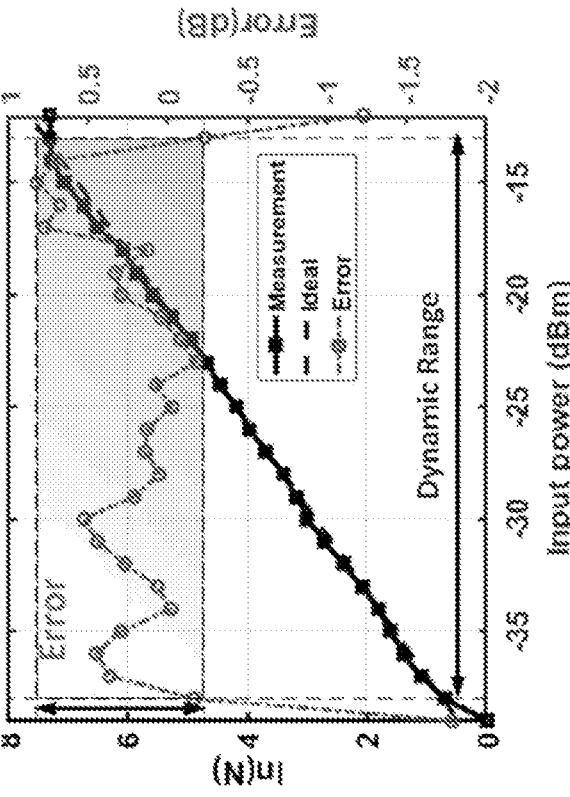

FIG. 17B shows the comparison between the simulated and measured results for the dynamic range after accounting for insertion loss. The reported slope from the measurements matches with the simulated results and an error of ±0.5 dB between the measurement and simulation results highlights the overall accuracy of the entire setup.

Figure 18:
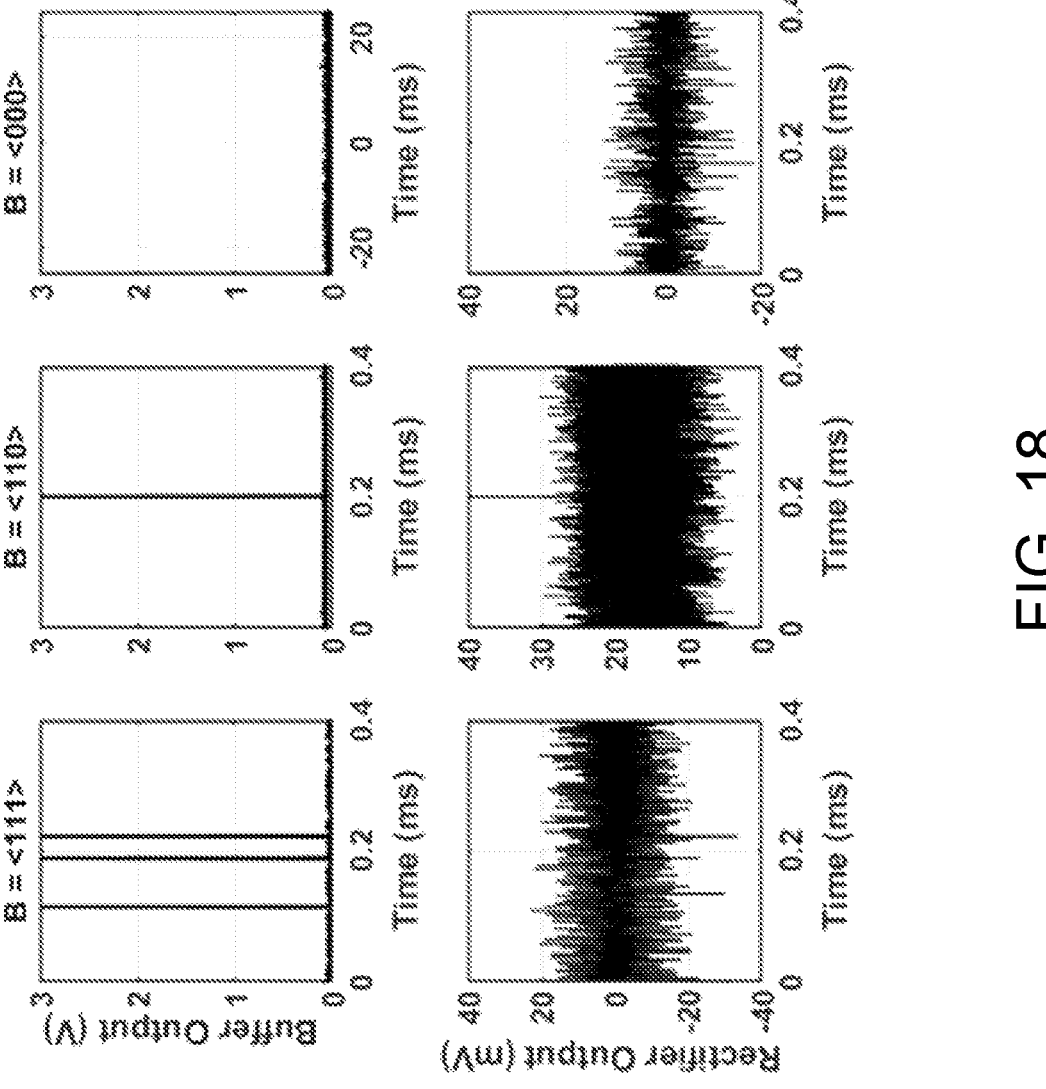
FIG. 18 shows measurement results showing how programming of the inverter threshold controls the trip point of the comparator with input power at 0.38 dBm at 900 MHz. (a) B=<111> sets the minimum threshold for the comparator and results in multiple switching, (b) B=<110> sets the next higher threshold and consequently results in one toggle at −38 dBm, and (c) B=<000> sets the highest threshold and no toggling is measured.

3) Noise Resilience Measurements: We performed experiments to measure the noise performance of the RSSI circuit. FIG. 13 shows the ability of the comparator to detect a low signal at ≈1 mV output voltage of the rectifier. It shows higher resilience to DC-offset and low frequency noise. We can further raise the trip point of the comparator by controlling the switching threshold of the programmable inverter (FIG. 7A). FIG. 18 shows the measurement results of the RSSI output toggle with a 900 MHz OOK signal sent at –38 dBm input power. The 3-bit control signal B is used to control the inverter threshold (FIG. 9B). B=<111>, which sets the lowest trip point for the comparator, shows 3 toggles at –38 dBm. In all our measurements, B=<110> is used, which sets the comparator threshold to ≈1 mV shows a single toggle. B=<000> sets the highest threshold and no comparator toggling is seen at this power level.

Figures 19A, 19B, 20:
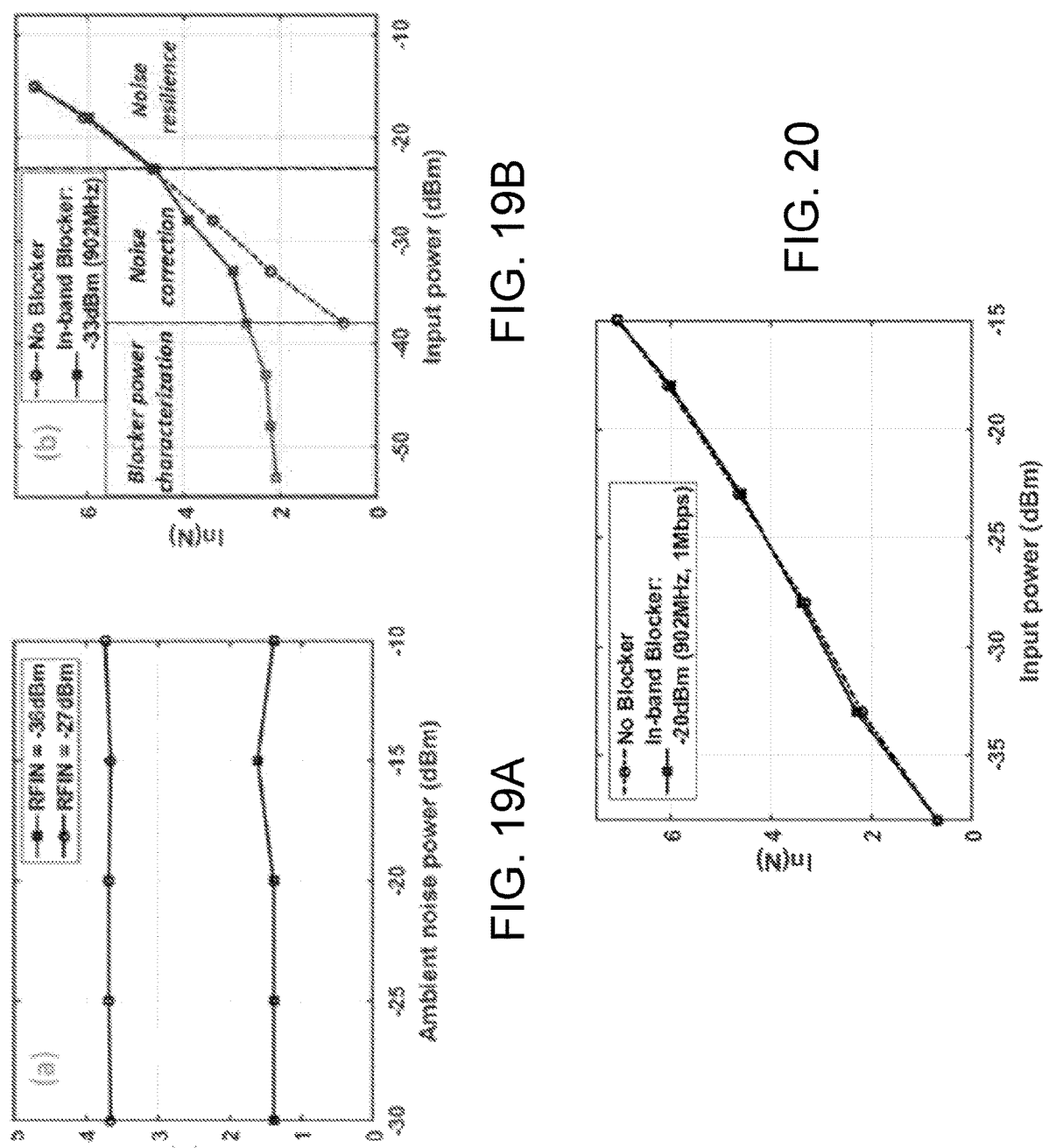
FIG. 19A shows performance measurements of the RSSI circuit in the presence of ambient RF noise, with RSSI output measured for a 900 MHz signal at −36 dBm and −27 dBm with a continuous wave 902 MHz in-band blocker at different power levels.
FIG. 19B shows performance measurements of the RSSI circuit in the presence of ambient RF noise, with RSSI output measured with OOK modulated −33 dBm, 902 MHz in-band blocker.
FIG. 20 shows performance measurement of the RSSI circuit in the presence of in-band blocker of 0.20 dBm at 902 MHz OOK modulated at 1 Mbps.

We also characterized the RSSI circuit in the presence of the ambient RF noise and in-band blocker. FIGS. 19A-19C show our measurement results for the ambient noise and in-band blocker.

Ambient Noise: In one experiment, we applied a continuous wave (CW) in-band blocker at 902 MHz (2 MHz offset) with its power varying from –30 to –10 dBm. The input signal was OOK modulated signal at 900 MHz. We observed RSSI output toggle count at –36 dBm and –27 dBm input power. FIG. 19A shows the measurement result for the CW blocker. In the presence of the CW blocker or ambient noise, the rectifier output settles to its corresponding DC voltage level. Thus, the RSSI circuit with the DC-offset correction only responds to the primary input signal and number of toggles remain same even in the presence of CW blocker or ambient noise.

In-band interference: For the in-band blocker, we applied a 0.1 kbps (10% duty cycle) OOK modulated in-band blocker at 902 MHz (2 MHz offset) with a power level of −33 dBm and varied the input power level from −55 to −13 dBm. FIG. 19B shows the measurement results. We highlight three regions to see the effect of in-band blocker on the number of output toggles.

For low input power level (<−38 dBm), we see that the toggling at the output is dominated by in-band blocker. This toggle count can be used to characterize the (OOK modulated) in-band blocker (Blocker power characterization in FIG. 19B). At higher input power levels, the output toggles represent the combined effect of the in-band blocker with the input signal. This deviation of the toggle count can be compensated from the Blocker power characterization mode, which can be used to improve the accuracy of detection (Noise correction in FIG. 19B). When we further increase the input power level, the number of toggles is dominated by the input power, minimizing the effect of in-band blocker in the detection accuracy (Noise resilience in FIG. 19B).

We also measured the performance of the RSSI circuit in presence of an in-band blocker OOK modulated at high data rate. In FIG. 20 we present the measurement results when we applied a 1 Mbps OOK modulated in-band blocker at 902 MHz (2 MHz offset) with a power level of −20 dBm and varied the input power level from −40 to −13 dBm. The number of toggles remain unaffected owing to the band-pass characteristics of the comparator in our RSSI circuit (FIG. 8B).

Figures 21A, 21B, 22:
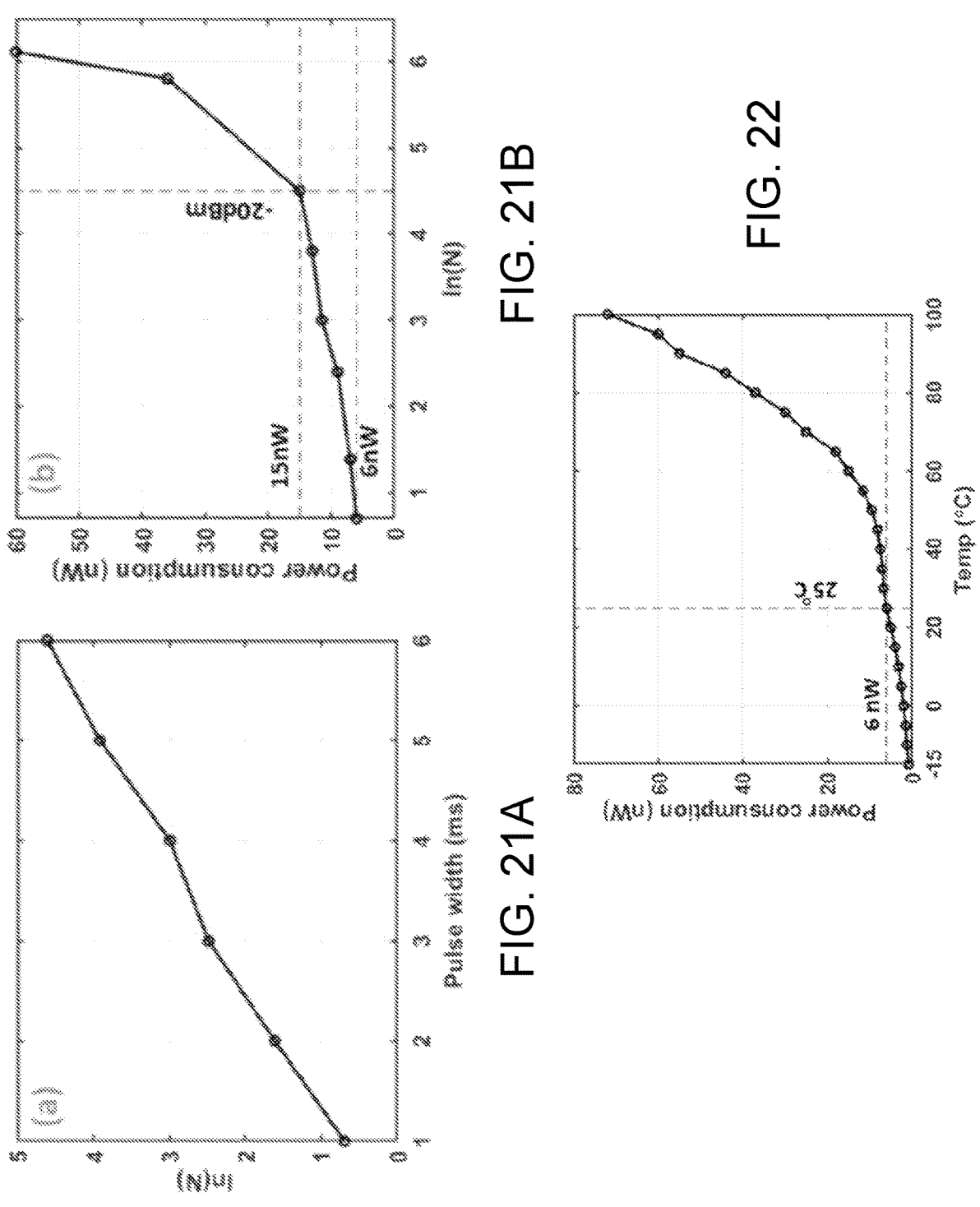
FIG. 21A shows measurement results showing the toggle count for different symbol pulse width with input RF signal at 900 MHz and −37 dBm power.
FIG. 21B shows measurement results showing power consumption of the RSSI circuit for different number of output toggles.
FIG. 22 shows measurement results showing the variation in the power consumption across a temperature range of −15° C. to 100° C. for the minimum detectable power.

4) Modulation Speed Measurement: We also measured the response of the circuit to different modulation speed. FIG. 21A shows the measurement results of the output toggles for an input power of −37 dBm input power at 900 MHz OOK modulated at different modulation speeds. We varied the modulation speed by changing the pulse width from 1 ms to 6 ms over a 10 ms time period. As expected, the toggle count increases with increase in the symbol duration (Eq. 11).

5) Power Consumption Measurements: FIG. 21B shows the measurement results for the power consumption of the proposed RSSI circuit for different number of output toggles. As the number of toggles increase, the overall power consumption increases on account of higher switching in the circuit. For the minimum detectable power, the power consumption of the comparator dominates at 6 nW. For −20 dBm input power, the proposed circuit consumes 15 nW power. The circuit consumes 6 nW for the minimum detectable power of −38 dBm. We also measured the power consumption of the circuit across temperature variation for a OOK modulated signal at 900 MHz when the circuit generates single toggle at the output. We used a proportional to absolute current reference (PTAT) to bias the comparator across the temperature range for a constant transconductance [36]. FIG. 22 shows the measurement results of the power consumption across the range of temperature from −15° C. to 100° C. for the minimum detectable power.

B. Figure of Merit

Table III (FIG. 25) compares our RSSI circuit with the other works. Our proposed RSSI circuit reports the highest Figure of Merit (FOM) among other works where FOM defined as [35], $$FOM(10^{12}) = \frac{10^{(DR/20)} \cdot f_{max}}{P}$$

where DR is the dynamic range, $f_{max}$ is the maximum frequency of operation and P is the power consumption. From Table III (FIG. 25), we see that our work reports the lowest power consumption of 15 nW at −20 dBm input power corresponding to 100 toggles and a high detection accuracy±0.5 dB when compared to the other works. The active area of the proposed circuit is 0.04 mm$^2$ and no off-chip component is used.

VI. Conclusion

An ultra-low power RSSI circuit implemented in a 65-nm CMOS process with a 1V supply is disclosed. The novel technique of direct conversion of the RF signal to a digital code presents several advantages over the conventional successive detection architecture. The direct RF to digital code converter RSSI circuit consumes a power of 15 nW at −20 dBm and achieves a dynamic range of 26 dB without any off-chip component. With noise and offset correction and digital implementation of the detection, we have achieved an accuracy of ±0.5 dB. The mathematical analysis of the toggling rate of the RSSI circuit is in strong agreement with the simulation and measurement results. We showed the measurement results of the sensitivity of the proposed RSSI circuit across a broad range of frequencies (600 MHz to 1.3 GHz), temperature range (−15° C. to 100° C.) and process variation. We also presented the measurement results of the noise performance of the proposed RSSI circuit under ambient noise and in-band blockers and the corrective measures to achieve noise resilience. The RSSI circuit also has the highest FOM among the other reported works for the RSSI-based detection.

Having thus described several illustrative embodiments, it is to be appreciated that various alterations, modifications, and improvements will readily occur to those skilled in the art. Such alterations, modifications, and improvements are intended to form a part of this disclosure, and are intended to be within the spirit and scope of this disclosure. While some examples presented herein involve specific combinations of functions or structural elements, it should be understood that those functions and elements may be combined in other ways according to the present disclosure to accomplish the same or different objectives. In particular, acts, elements, and features discussed in connection with one embodiment are not intended to be excluded from similar or other roles in other embodiments. Additionally, elements and components described herein may be further divided into additional components or joined together to form fewer components for performing the same functions.

Accordingly, the foregoing description and attached drawings are by way of example only, and are not intended to be limiting.

REFERENCES

[1] "IoT market size worldwide 2017-2025." [Online]. Available: https://www.statista.com/statistics/976313/global-iot-market-size/

[2] J. Jang, Y. Lee, H. Cho, and H.-J. Yoo, "A 540-μW Duty Controlled RSSI with Current Reusing Technique for Human Body Communication," IEEE Transactions on Biomedical Circuits and Systems, vol. 10, no. 4, pp. 893-901, 2016.

[3] S. Byun, "Analysis and Design of CMOS Received Signal Strength Indicator," IEEE Transactions on Circuits and Systems I: Regular Papers, vol. 61, no. 10, pp. 2970-2977, 2014.

[4] R. Luo, X. Bai, S. Diao, and F. Lin, "A 1 mW CMOS limiting amplifier and RSSI for ZigBee™ applications," in 2013 IEEE International Wireless Symposium (IWS), 2013, pp. 1-4.

[5] C. P. Wu and H.-W. Tsao, "A 110-MHz 84-dB CMOS programmable gain amplifier with integrated RSSI function," IEEE Journal of Solid-State Circuits, vol. 40, no. 6, pp. 1249-1258, 2005.

[6] P. C. Huang, Y.-H. Chen, and C.-K. Wang, "A 2-V 10.7-MHz CMOS limiting amplifier/RSSI," IEEE Journal of Solid-State Circuits, vol. 35, no. 10, pp. 1474-1480, 2000.

[7] X. Hao, Y. Zheng, F. Tian, Q. Zhou, H. Li, Z. Liu, J. Liu, and H. Liao, "A Reverse-RSSI Logarithmic Power Detector With +35-dBm Maximum Detectable Power in 180-nm CMOS," IEEE Microwave and Wireless Components Letters, vol. 29, no. 9, pp. 610-613, 2019.

[8] Z. Shi, Y. Yang, and L. Di, "A low-power ADC with compact AGC loop for LR-WPAN receivers," Analog Integrated Circuits and Signal Processing, vol. 84, July 2015.

[9] X. Wang, B. Chi, and Z. Wang, "A Low-Power High-Data-Rate ASK IF Receiver With a Digital-Control AGC Loop," IEEE Transactions on Circuits and Systems II: Express Briefs, vol. 57, no. 8, pp. 617-621, 2010.

[10] C. Bai, J. Wu, and M. Zhang, "A CMOS low power fast-settling AGC amplifier based on integrated RSSI," Analog Integrated Circuits and Signal Processing, vol. 87, no. 3, pp. 379-387, 2016.

[11] J. S. Silva, B. Krishnamachari, and F. Boavida, Eds., Wireless Sensor Networks, ser. Lecture Notes in Computer Science. Berlin, Heidelberg: Springer Berlin Heidelberg, 2010, vol. 5970. [Online]. Available: http://link.springer.com/10.1007/978-3-642-11917-0

[12] S. Abeywickrama, T. Samarasinghe, C. K. Ho, and C. Yuen, "Wireless Energy Beamforming Using Received Signal Strength Indicator Feed-back," IEEE Transactions on Signal Processing, vol. 66, no. 1, pp. 224-235, 2018.

[13] A. Buffi, A. Michel, P. Nepa, and B. Tellini, "RSSI Measurements for RFID Tag Classification in Smart Storage Systems," IEEE Transactions on Instrumentation and Measurement, vol. 67, no. 4, pp. 894-904, 2018.

[14] Y. Zhang, N. Mirchandani, M. Onabajo, and A. Shrivastava, "RSSI Amplifier Design for a Feature Extraction Technique to Detect Seizures with Analog Computing," in 2020 IEEE International Symposium on Circuits and Systems (ISCAS), 2020, pp. 1-5.

[15] "IEEE Standard for Low-Rate Wireless Networks," IEEE Std 802.15.4-2020 (Revision of IEEE Std 802.15.4-2015), pp. 1-800, 2020.

[16] N. Shafiee, S. Tewari, B. Calhoun, and A. Shrivastava, "Infrastructure Circuits for Lifetime Improvement of Ultra-Low Power IoT Devices," IEEE Transactions on Circuits and Systems I: Regular Papers, vol. 64, no. 9, pp. 2598-2610, 2017.

[17] E. Nash, "Analog Dialogue," Analog Dialogue, pp. 30-33, 1999. [Online]. Available: https://www.analog-.com/en/analog-dialogue/articles/logarithmic-amplifiers-explained.html

[18] M. Ding, P. Zhang, C. Lu, Y. Zhang, S. Traferro, G.-J. van Schaik, Y.-H. Liu, J. Huijts, C. Bachmann, G. Dolmans, and K. Philips, "A 2.4 GHz BLE-compliant fully-integrated wakeup receiver for latency-critical IoT applications using a 2-dimensional wakeup pattern in 90 nm CMOS," in 2017 IEEE Radio Frequency Integrated Circuits Symposium (RFIC), 2017, pp. 168-171.

[19] EDN, "Understand receiver dynamics and AGC tradeoffs in WiMAX femto- and picocells," September 2008. [Online]. Available: https://www.edn.com/understand-receiver-dynamics-and-agc-tradeoffs-in-wimax-femto-and-picocells/

[20] A. Vlavianos, L. K. Law, I. Broustis, S. V. Krishnamurthy, and M. Faloutsos, "Assessing link quality in IEEE 802.11 Wireless Networks: Which is the right metric?" in 2008 IEEE 19th International Symposium on Personal, Indoor and Mobile Radio Communications, 2008, pp. 1-6.

[21] B. Attila and C. Lung, "On the relationship between received signal strength and received signal strength index of IEEE 802.11 compatible radio transceivers," Carpathian Journal of Electronic and Computer Engineering, vol. 6, pp. 15-20, December 2013.

[22] H. Kwasme and S. Ekin, "RSSI-Based Localization Using LoRaWAN Technology," IEEE Access, vol. 7, pp. 99 856-99 866, 2019.

[23] G. Chong, H. Ramiah, J. Yin, J. Rajendran, W. R. Wong, P.-I. Mak, and R. P. Martins, "CMOS Cross-Coupled Differential-Drive Rectifier in Subthreshold Operation for Ambient RF Energy Harvesting—Model and Analysis," IEEE Transactions on Circuits and Systems II: Express Briefs, vol. 66, no. 12, pp. 1942-1946, 2019.

[24] E. Guglielmi, F. Toso, F. Zanetto, G. Sciortino, A. Mesri, M. Sampietro, and G. Ferrari, "High-value tunable pseudo-resistors design," IEEE Journal of Solid-State Circuits, vol. 55, no. 8, pp. 2094-2105, 2020.

[25] R. Maheshwari, S. Jain, and S. R. Das, "A measurement study of interference modeling and scheduling in low-power wireless networks," in Proceedings of the 6th ACM conference on Embedded network sensor systems, 2008, pp. 141-154.

[26] K.-K. Huang, J. K. Brown, N. Collins, R. K. Sawyer, F. B. Yahya, A. Wang, N. E. Roberts, B. H. Calhoun, and D. D. Wentzloff, "21.3 A Fully Integrated 2.7 μW-70.2 dBm-Sensitivity Wake-Up Receiver with Charge-Domain Analog Front-End, −16.5 dB-SIR, FEC and Crypto-graphic Checksum," in 2021 IEEE International Solid-State Circuits Conference (ISSCC), vol. 64, 2021, pp. 306-308.

[27] "Europe seeks to harmonize 900 MHz band for next-gen IoT and RFID." [Online]. Available: https://enterpriseiotinsights.com/20181015/channels/news/europe-seeks-to-hamonise-900mhz

[28] "FCC approves 'small-but-mighty' 900 MHz tranche for private LTE for US utilities." [Online]. Available: https://enterpriseiotinsights.com/20200514/channels/news/fcc-approves-900-mhz-tranche-for-private-lte-for-utilities

[29] J. Wang, Y. Zheng, F. Yang, F. Tian, and H. Liao, "A wide band CMOS radio frequency RMS power detector with 42-dB dynamic range," in 2015 IEEE International Symposium on Circuits and Systems (ISCAS), 2015, pp. 1678-1681.

[30] X. Zhang, B. Chi, B. Liu, and Z. Wang, "−80 dBm⁻0 dBm dynamic range, 30 mV/dB detection sensitivity piecewise RSSI for SDR/CR receivers," in 2014 IEEE 57th International Midwest Symposium on Circuits and Systems (MWSCAS), 2014, pp. 89-92.

[31] J. Choi, J. Lee, Y. Xi, S.-S. Myoung, S. Baek, D. H. Kwon, Q.-D. Bui, J. Lee, D. Oh, and T. B. Cho, "Wide Dynamic-Range CMOS RMS Power Detector," IEEE Transactions on Microwave Theory and Techniques, vol. 64, no. 3, pp. 868-880, 2016.

[32] M. Zhang, R. Liu, Y. Zhang, W. Wang, H. Liu, and C. Lu, "A fully integrated RSSI and an ultra-low power SAR ADC for 5.8 GHz DSRC ETC transceiver," AEU—International Journal of Electronics and Communications, vol. 86, pp. 154-163, 2018. [Online]. Available: https://www.sciencedirect.comiscience/article/pii/S143484111732215X

[33] C. Li, C. C. Boon, X. Yi, Z. Liang, and K. Yang, "Compact Switched-Capacitor Power Detector With Frequency Compensation in 65-nm CMOS," IEEE Access, vol. 8, pp. 34 197-34 203, 2020.

[34] C.-J. Jeong, Y. Sun, S.-K. Han, and S.-G. Lee, "A 2.2 mW, 40 dB Automatic Gain Controllable Low Noise Amplifier for FM Receiver," IEEE Transactions on Circuits and Systems I: Regular Papers, vol. 62, no. 2, pp. 600-606, 2015.

[35] B. Rumberg and D. W. Graham, "A Low-Power Magnitude Detector for Analysis of Transient-Rich Signals," IEEE Journal of Solid-State Circuits, vol. 47, no. 3, pp. 676-685, 2012.

[36] N. Mirchandani and A. Shrivastava, "High Stability Gain Structure and Filter Realization with less than 50 ppm/° C. Temperature Variation with Ultra-low Power Consumption using Switched-capacitor and Sub-threshold Biasing," in 2018 IEEE International Symposium on Circuits and Systems (ISCAS), 2018, pp. 1-5.

The invention claimed is:

1. A method of detecting radio frequency (RF) signal strength using a Receiver Signal Strength Indicator (RSSI) circuit in a wake up radio of an RF receiver, the method comprising the steps of:
   (a) receiving an incoming RF signal;
   (b) rectifying the RF signal in a multi-stage passive rectifier to generate an output voltage;
   (c) comparing the output voltage to a threshold voltage in a comparator and generating a toggle signal when the output voltage exceeds the threshold voltage;
   (d) feeding the toggle signal to the multi-stage passive rectifier to discharge a capacitor for each stage of the multi-stage passive rectifier to enable another charging cycle;
   (e) repeating steps (b) to (d) a plurality of times during a duration of the RF signal; and
   (f) counting the toggle signals from the comparator to generate a digital code indicative of the detected strength of the RF signal; and
   (g) outputting the digital code.

2. The method of claim 1, further comprising using a low frequency noise cancellation circuit in a feedback loop of the comparator to correct for offset voltage and noise from the rectifier.

3. The method of claim 1, wherein the low frequency noise cancellation circuit comprises a first order low pass filter.

4. The method of claim 1, wherein the RSSI circuit directly generates the digital code without an analog to digital converter (ADC).

5. The method of claim 1, wherein the method is implemented in an internet-of-things (IoT) device.

6. The method of claim 1, wherein the RSSI circuit is implemented in a 65-nm CMOS process.

7. The method of claim 1, wherein the RSSI circuit consumes about 15 nW power and has a linear dynamic range of about 26 dB.

8. The method of claim 1, wherein the comparator comprises a differential amplifier followed by a common source stage.

9. The method of claim 1, further comprising tuning a beamforming matrix for a multiple-input and multiple-output (MIMO) system based on the digital code output in step (g).

10. A Receiver Signal Strength Indicator (RSSI) circuit in a wake up radio of a radio frequency (RF) receiver for detecting RF signal strength, comprising:
   a multi-stage passive rectifier for rectifying an incoming RF signal to generate an output voltage;
   a comparator coupled to the multi-stage passive rectifier for comparing the output voltage to a threshold voltage and generating a toggle signal when the output voltage exceeds the threshold voltage, wherein the comparator feeds the toggle signal to the multi-stage passive rectifier to discharge a capacitor for each stage of the multi-stage passive rectifier to enable another charging cycle for a plurality of times during a duration of the RF signal; and
   a counter coupled to the comparator for counting the toggle signals from the comparator to generate a digital code indicative of the detected strength of the RF signal.

11. The RSSI circuit of claim 10, further comprising a low frequency noise cancellation circuit in a feedback loop of the comparator to correct for offset voltage and noise from the rectifier.

12. The RSSI circuit of claim 11, wherein the low frequency noise cancellation circuit comprises a first order low pass filter.

13. The RSSI circuit of claim 10, wherein the RSSI circuit directly generates the digital code without an analog to digital converter (ADC).

14. The RSSI circuit of claim 10, wherein the circuit is implemented in an internet-of-things (IoT) device.

15. The RSSI circuit of claim 10, wherein the RSSI circuit is implemented in a 65-nm CMOS process.

16. The RSSI circuit of claim 10, wherein the RSSI circuit consumes about 15 nW power and has a linear dynamic range of about 26 dB.

17. The RSSI circuit of claim 10, wherein the comparator comprises a differential amplifier followed by a common source stage.

18. The RSSI circuit of claim 10, wherein the digital code is used for tuning a beamforming matrix for a multiple-input and multiple-output (MIMO) system.

19. A Receiver Signal Strength Indicator (RSSI) circuit in a wake up radio of a radio frequency (RF) receiver for detecting RF signal strength, comprising:
   a multi-stage passive rectifier for rectifying an incoming RF signal to generate an output voltage;
   a comparator coupled to the multi-stage passive rectifier for comparing the output voltage to a threshold voltage and generating a toggle signal when the output voltage exceeds the threshold voltage, wherein the comparator feeds the toggle signal to the multi-stage passive rectifier to discharge a capacitor for each stage of the multi-stage passive rectifier to enable another charging cycle for a plurality of times during a duration of the RF signal, wherein the comparator includes a programmable inverter configured to detect the output voltage in the presence of ambient RF noise; and a counter coupled to the comparator for counting the toggle signals from the comparator to generate a digital code indicative of the detected strength of the RF signal.

20. The RSSI circuit of claim 19, wherein the circuit is implemented in an internet-of-things (IoT) device.

\* \* \* \* \*